United States Patent
Ohnuma

(10) Patent No.: US 7,091,110 B2
(45) Date of Patent: Aug. 15, 2006

(54) METHOD OF MANUFACTURING A SEMICONDUCTOR DEVICE BY GETTERING USING A ANTI-DIFFUSION LAYER

(75) Inventor: Hideto Ohnuma, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 10 days.

(21) Appl. No.: 10/458,622

(22) Filed: Jun. 11, 2003

(65) Prior Publication Data
US 2003/0232468 A1    Dec. 18, 2003

(30) Foreign Application Priority Data
Jun. 12, 2002    (JP) ............................. 2002-171224

(51) Int. Cl.
*H01L 21/322* (2006.01)
(52) U.S. Cl. .................................................. 438/471
(58) Field of Classification Search ............... 438/143, 438/149, 162, 310, 402, 471, 476
See application file for complete search history.

(56) References Cited

U.S. PATENT DOCUMENTS

| | | | |
|---|---|---|---|
| 5,789,284 A * | 8/1998 | Yamazaki et al. ........ | 438/166 |
| 5,923,962 A | 7/1999 | Ohtani et al. | |
| 5,985,740 A * | 11/1999 | Yamazaki et al. ........ | 438/486 |
| 6,071,766 A * | 6/2000 | Yamazaki et al. ........ | 438/166 |
| 6,337,259 B1 * | 1/2002 | Ueda et al. ................ | 438/471 |
| 6,376,336 B1 * | 4/2002 | Buynoski .................... | 438/476 |
| 6,399,454 B1 | 6/2002 | Yamazaki | |
| 6,670,259 B1 * | 12/2003 | Chan ........................... | 438/473 |
| 6,686,262 B1 | 2/2004 | Yamazaki et al. | |
| 6,743,700 B1 | 6/2004 | Asami et al. | |
| 6,808,968 B1 * | 10/2004 | Takayama et al. ........ | 438/166 |
| 6,821,828 B1 * | 11/2004 | Ichijo et al. ................ | 438/166 |
| 6,830,617 B1 | 12/2004 | Ohtani et al. | |
| 2002/0048908 A1 * | 4/2002 | Koveshnikov et al. ...... | 438/476 |
| 2002/0098628 A1 | 7/2002 | Hamada et al. | |
| 2002/0125480 A1 * | 9/2002 | Nakamura et al. ........... | 257/66 |
| 2002/0134981 A1 | 9/2002 | Nakamura et al. | |
| 2002/0151120 A1 | 10/2002 | Yamazaki et al. | |
| 2002/0164843 A1 | 11/2002 | Yamazaki et al. | |

(Continued)

FOREIGN PATENT DOCUMENTS

JP    07-183540    7/1995

(Continued)

OTHER PUBLICATIONS

Stanley Wolf and Richard N. Tauber, Silicon Processing For The VLSI Era, 1986, Lattice Press, vol. 1, pp. 191-195.*

*Primary Examiner*—Michael Lebentritt
*Assistant Examiner*—Stanetta Isaac
(74) *Attorney, Agent, or Firm*—Eric J. Robinson; Robinson Intellectual Property Law Office, P.C.

(57) ABSTRACT

A technique, where a semiconductor film having a crystal structure is obtained using a metal element that helps crystallization of the semiconductor film, then that metal element remained in the film is effectively removed, as a result variation among elements is reduced, is provided. In a process for forming a gettering site, a semiconductor film containing a rare-gas element is formed, then an anti-diffusion film for preventing diffusion of the rare-gas element is formed, thereby the metal element in another semiconductor film is effectively removed, particularly in a gettering that is a heating treatment at a high temperature of 600° C. or more.

32 Claims, 13 Drawing Sheets

U.S. PATENT DOCUMENTS

2002/0182783 A1    12/2002    Takayama et al.
2004/0224486 A1    11/2004    Ichijo et al.

FOREIGN PATENT DOCUMENTS

JP      08-078329    3/1996

* cited by examiner

F I G. 2
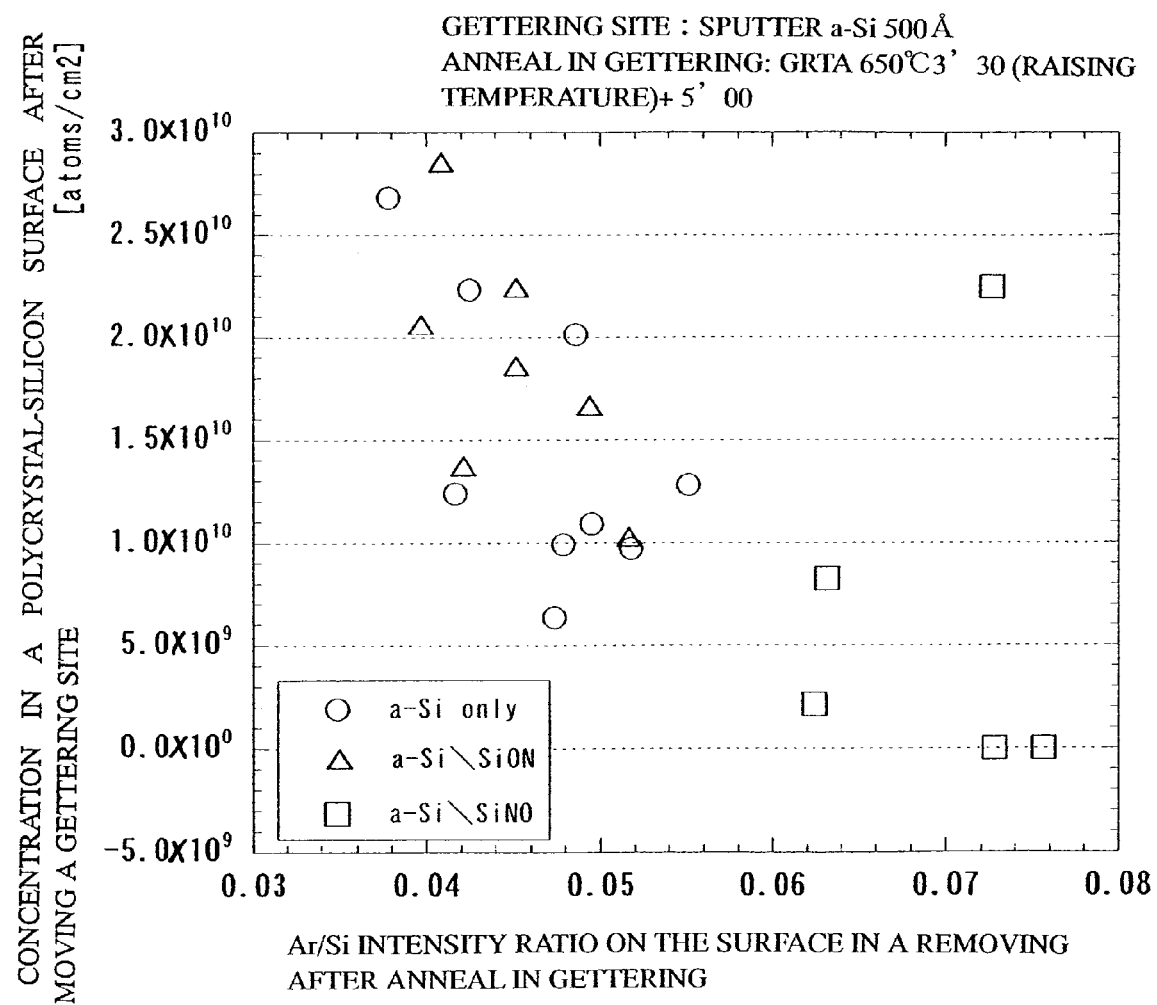

Ni CONCENTRATIONS ON THE SURFACE AFTER REMOVING AN ANTI-DIFFUSION FILM AND AFTER REMOVING THE GETTERING SITE

○ After gettering anneal and removal of acid: sputter Si surface
△ After removing gettering site: CG-Si surface GETTERING SITE a-Si : Ar SPUTTER 50nm
ANNEAL IN GETTERING: GRTA 650°C3' 30
(RAISING TEMPERATURE)+ 5' 00
Raman measurement: ×500, 20sec, 10 points GETTERING SITE a-Si : Ar SPUTTER 50nm
ANNEAL IN GETTERING: GRTA 650°C3' 30
(RAISING TEMPERATURE)+ 5' 00
Raman measurement: ×500, 20sec, 10 point

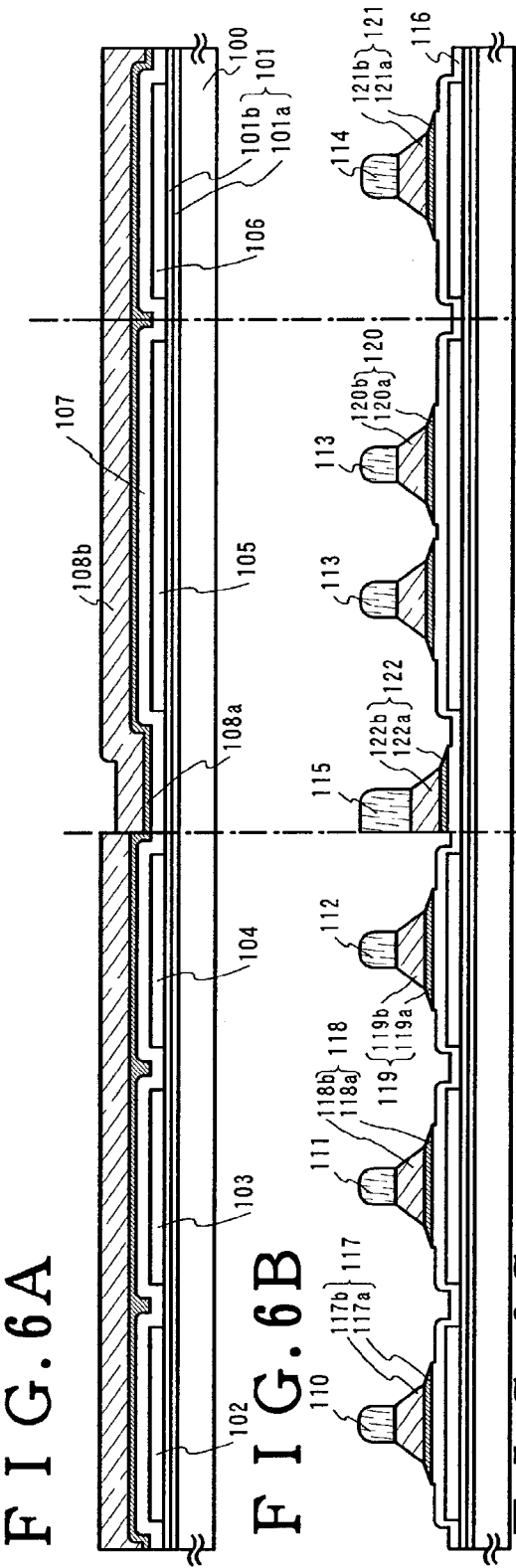

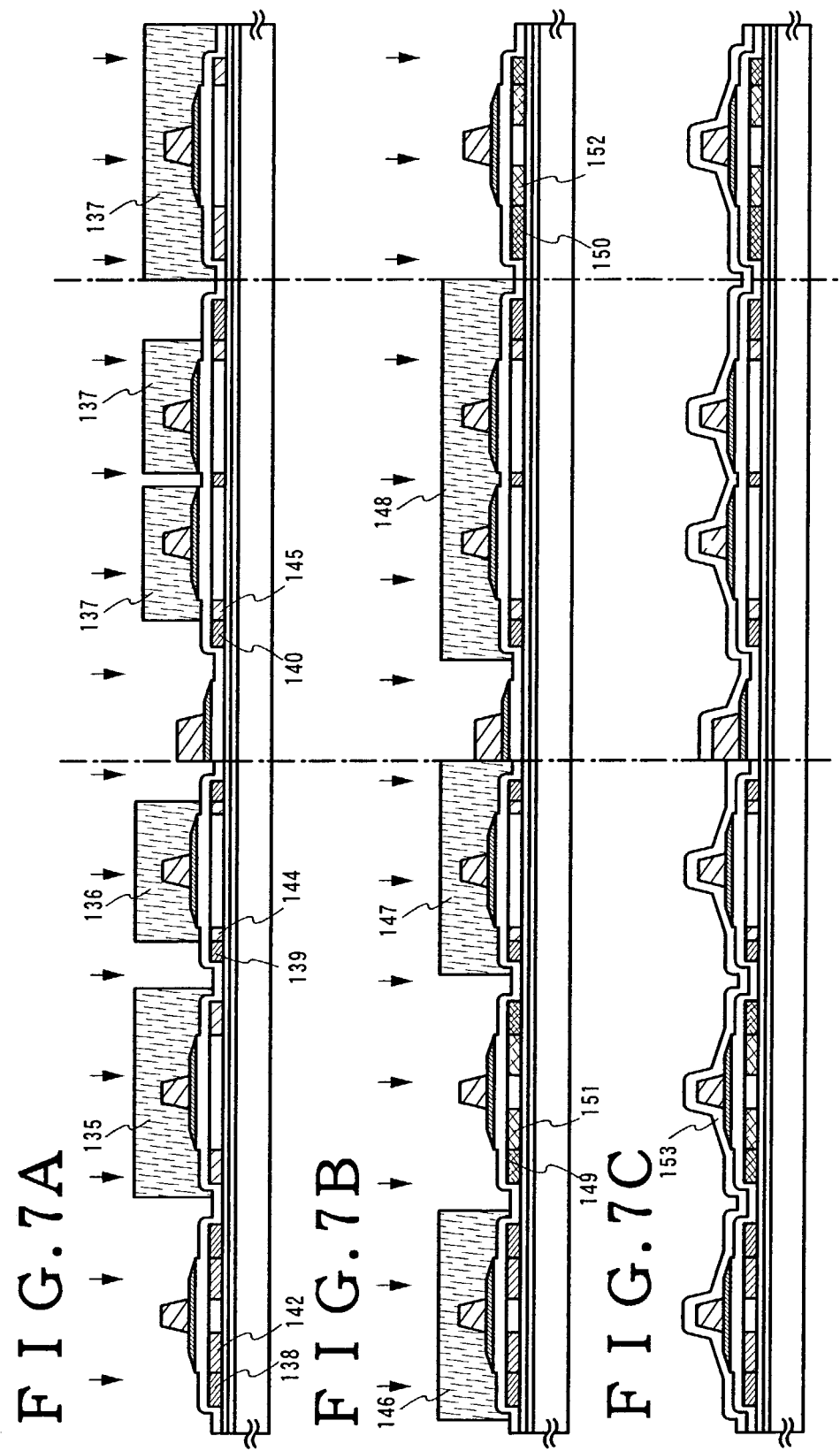

F I G. 9
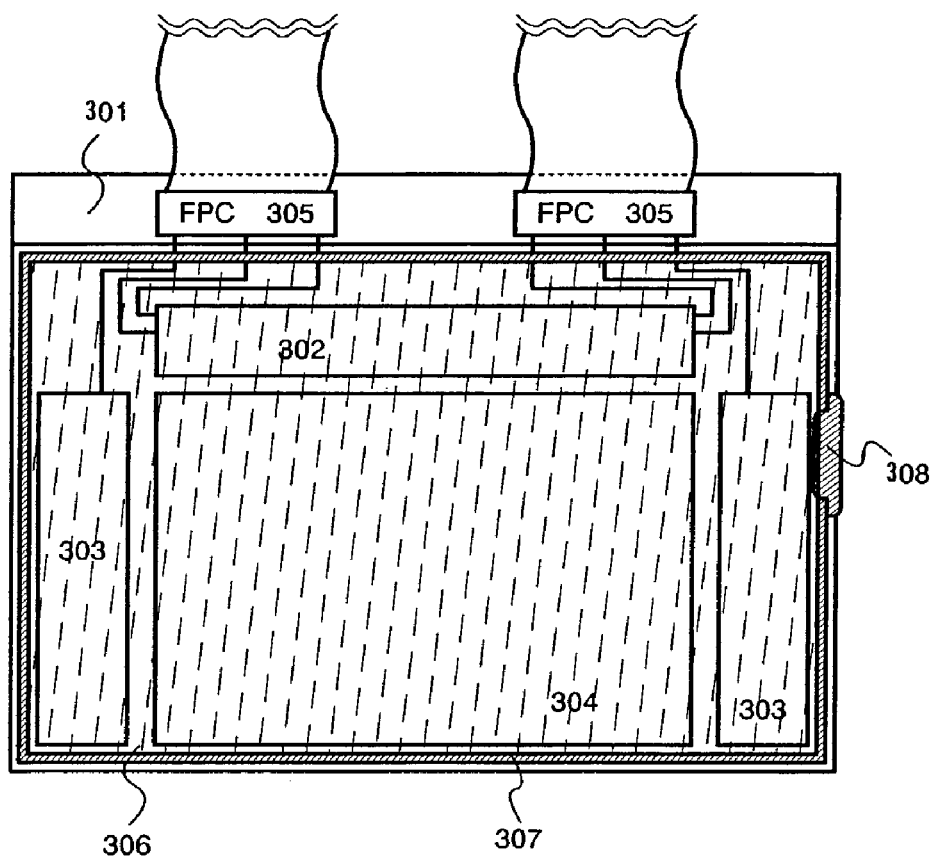

METHOD OF MANUFACTURING A SEMICONDUCTOR DEVICE BY GETTERING USING A ANTI-DIFFUSION LAYER

BACKGROUND OF THE INVENTION

1. Field of the Invention

The present invention relates to a semiconductor device which has circuits structured by thin film transistors (hereafter referred to as TFTs) and to a method for fabricating the same. For example, the present invention relates to an electro-optical device, typically represented by a liquid crystal display panel, and to an electronic apparatus in which a light emitting display device having light emitting elements is installed as a part.

Note that, in the specification, the term, semiconductor devices, indicates a category of general devices which are capable of functioning by utilizing semiconductor characteristics, and electro-optical devices, semiconductor circuits, and electronic apparatuses are all included in the category of semiconductor devices.

2. Description of the Related Art

Thin film transistors (hereinafter referred to as TFTs) are known as a typical semiconductor element that use a semiconductor film having a crystal structure. The TFTs are attracting attention as a technique of forming an integrated circuit on a glass or other insulating substrates, and devices utilizing the TFTs, such as a liquid crystal display device with a built-in driving circuit, are beginning to appear on the market. In prior art, a semiconductor film with a crystal structure is formed by using a heat treatment or a laser annealing to crystallize an amorphous semiconductor film that is obtained by deposition through a plasma CVD method or a reduced pressure CVD method. (Laser annealing is a technique of crystallizing a semiconductor film through irradiation of laser light.)

The thus formed semiconductor film with a crystal structure is a mass of crystal grains. Since the crystal grains are randomly oriented and the orientation thereof cannot be controlled, the semiconductor film affects TFT characteristics. JP 07-183540 A discloses a technique to tackle this problem. The technique involves doping with a metallic element such as nickel that helps crystallization of a semiconductor film, to form a semiconductor film having a crystal structure. The technique can cause a large proportion of crystal grains to orient in the same direction, and can lower the heating temperature required for crystallization as well. When such a semiconductor film having a crystal structure is used to form a TFT, not only the field effect mobility will be improved, but also the sub-threshold coefficient (S value) will be reduced to improve the electric characteristics of the TFT greatly.

By using a metallic element for promoting crystallization, generation of nuclei in crystallization can be controlled. Therefore, film quality thus obtained is uniform in comparison with another crystallization method in which nuclei are generated at random, and ideally, it is desirable that metallic elements are completely removed or reduced to an allowable range. However, the metallic element added for helping crystallization remains in the semiconductor film having a crystal structure, or on the surface thereof, causing problems such as fluctuation in characteristic of semiconductor elements obtained. For example, the remained metallic element increases OFF current in the TFTs to cause fluctuation between the semiconductor elements. In short, the metallic element for helping crystallization becomes an unwanted presence once the semiconductor film having a crystal structure is formed.

Gettering using phosphorus is actively employed as an effective method of removing a metallic element that helps crystallization from a specific region of a semiconductor film having a crystal structure. For instance, the metallic element can readily be removed from a channel forming region by doping a source-drain region of a TFT with phosphorus and subjecting the film to heat treatment at 450 to 700° C.

Phosphorus is injected to the semiconductor film having a crystal structure by ion doping (ion doping is a method of dissociating $PH_3$ or the like by plasma and helping the obtained ions in the electric field to inject the ions into a semiconductor, and basically does not include ion mass separation). For gettering, the concentration of phosphorus in the semiconductor film has to be $1 \times 10^{20}/cm^3$ or higher. Phosphorus doping by ion doping makes the semiconductor film having a crystal structure amorphous, and an increased phosphorus concentration inhibits recrystallization during the subsequent annealing. In addition to this problem, high concentration phosphorus doping prolongs the treatment time required for doping and lowers the throughput in the doping step.

Furthermore, a source-drain region of a p-channel TFT which is doped with phosphorus needs boron in a concentration 1.5 to 3 times higher than the phosphorus concentration in order to reverse the conductivity type of the region. This makes the recrystallization difficult and raises the resistance of the source drain region undesirably.

Also, when sufficient gettering is not conducted in the substrate and a variation in gettering is caused, a slight difference, that is, a variation among respective TFT characteristics is caused. In the case of a transmission type liquid crystal display device, when there is a variation in the electrical characteristics of the TFTs located in a pixel portion, a variation in a voltage applied to each pixel electrode is caused. Thus, a variation in the amount of light to be transmitted is caused. This results in uneven display which is reflected in an eye of an observer.

Also, for a light emitting device using an OLED, a TFT becomes an essential element to realize an active matrix drive method. Thus, at least, a TFT which serves as a switching element and a TFT for supplying a current to the OLED are provided to each pixel of the light emitting device using the OLED. The luminance of the pixel is determined based on an on current (Ion) of the TFT which is electrically connected with the OLED and supplies a current to the OLED regardless of the circuit configuration of the pixel, and drive method. Accordingly, for example, when an entire white display is conducted, there is a problem in that a variation in luminance is caused if the on current is not kept constant.

SUMMARY OF THE INVENTION

The present invention has been made to solve such problems, and an object of the present invention is therefore to provide a technique of using a metallic element that helps crystallization of a semiconductor film to obtain a semiconductor film having a crystal structure and then effectively removing the metallic element remained in the film.

A gettering technique is positioned as one of main techniques in fabrication of an integrated circuit using a single crystal silicon wafer. The gettering is known as a technique where a metal impurity is segregated into a gettering site by some sort of energy, thereby an impurity concentration in an active region of an element is reduced. The gettering is classified into two main techniques: an extrinsic gettering and an intrinsic gettering. The extrinsic gettering provides the gettering effect by giving a strain field or chemical action from outside. Phosphorous-gettering, in which a high concentration of phosphorous is diffused from a backside of the single crystal silicon wafer, corresponds to this, or the gettering using the phosphorous can be regarded as one of the extrinsic gettering.

On the other hand, the intrinsic gettering is known as a gettering using a strain field due to lattice defects involving oxygen generated within the single crystal silicon wafer. This invention uses a gettering mechanism different from the extrinsic gettering and intrinsic gettering, and employs following methods in order to apply the mechanism to a semiconductor film having a crystal structure about 10 nm to 200 nm in thickness.

The invention has a process for forming a first semiconductor film having a crystal structure using a metal element on an insulating surface, process for forming a film to be an etching stopper (barrier layer), process for forming a second semiconductor film containing a rare-gas element (gettering site), process for forming an anti-diffusion film for the rare-gas element on the second semiconductor film, process for performing a heat treatment thereby performing a gettering of the metal element in the gettering site, process for removing the anti-diffusion film and the second semiconductor film, and process for removing the barrier layer.

Since the anti-diffusion film is a film for preventing desorption of the rare-gas element from the second semiconductor film during a heating treatment in the gettering process, a nitride having a high gas barrier property (typically silicon nitride film, or silicon oxynitride film) is preferably used for the film. Particularly, the film is effective when the heat treatment is performed at a high temperature of 600° C. or more. That is, by preventing the desorption of the rare-gas element from the second semiconductor film, a strong gettering ability of the gettering site can be maintained, and the metal element in the crystallized first semiconductor film can be reduced or removed as much as possible.

Further, for the anti-diffusion film, it is desired that film stress is a comparatively large, tensile stress, and it is better that a thickness range of the film is 10 nm to 300 nm.

A method for forming the second semiconductor film includes a sputter method or plasma CVD method, in particular, the plasma CVD method requires a reduced maintenance compared with the sputter method, because an inside of a deposition chamber (sometimes, referred to as chamber) can be cleaned with gas, therefore it can be said that the plasma CVD method is suitable for mass production. When the second semiconductor film containing the rare-gas element is formed by the plasma CVD method, the film is formed under conditions where monosilane and the rare-gas element are used as source gases, a ratio of monosilane to rare-gas is controlled to be 0.1/99.9 to 1/9, preferably 1/99 to 5/95, and a pressure is 1.333 Pa (0.01 Torr) to 133.322 Pa (1 Torr), preferably less than 53.32 Pa (0.4 Torr). When the deposition pressure is more than 133.322 Pa, powder may be formed other than a film, or deposition defects including a hemisphere scum in the film may occur frequently. Further, it is desirable that a RF power density is 0.0017 W/cm to 0.48 W/cm. When the RF power is more than 0.48 W/cm$^2$, powder may be formed other than a film, or the deposition defects including a hemisphere scum in the film may occur frequently. Disilane or trisilane can be also used in place of the monosilane. In the invention, it is important for forming a desired film by adjusting the deposition pressure, RF power, and particularly the ratio of silane properly.

By forming the second semiconductor film under the above condition, adhesion of the film with the barrier layer can be improved, and thus peeling due to a heat treatment after the deposition does not occur. In addition, a gettering site, which contains a high concentration of rare-gas element and has a high gettering ability, can be formed. Therefore, thickness of the second semiconductor film to be the gettering site can be reduced.

As another process for forming the second semiconductor film to be the gettering site, a semiconductor film which contains phosphorous or the rare-gas and has an amorphous structure can be formed by a deposition using the plasma CVD method, where the monosilane, phosphine ($PH_3$), and the rare-gas element, or the monosilane, the phosphine ($PH_3$), and hydrogen, or the monosilane, the phosphine ($PH_3$), and nitrogen are used as the source gases.

A configuration concerning the fabrication method disclosed in the specification comprises a method for fabricating a semiconductor device comprising forming a first semiconductor film having an amorphous structure over an insulating surface, providing the first semiconductor film having the amorphous structure with a metal element, crystallizing the first semiconductor film, forming a barrier layer over a surface of the crystallized first semiconductor film, forming a second semiconductor film containing a rare-gas element over the barrier layer, forming an anti-diffusion film for the rare-gas element over the second semiconductor film, performing a heating treatment, and thus performing the gettering of the metal element contained in the second semiconductor film, thereby removing or reducing the metal element in the crystallized first semiconductor film, removing the anti-diffusion film, removing the second semiconductor film, and removing the barrier layer.

In the configuration, the anti-diffusion film has a tensile stress in a range from $1 \times 10^8$ to $1 \times 10^{10}$ dyne/cm$^2$. The film stress of the anti-diffusion film exerts a tensile stress also on the second semiconductor film, thereby strain in the second semiconductor film is increased, and accordingly the gettering effect is improved.

In the configuration, the anti-diffusion film is the silicon nitride film or silicon oxynitride film. Particularly, in case of the silicon oxynitride film, in a film in which a large amount of nitrogen is contained compared with oxygen, the gettering effect is improved.

In the configuration, in forming the second semiconductor film containing the rare-gas element, it is better to form the film by the sputter method or plasma CVD method. When the film is formed by the plasma CVD method, it is preferable that a flow ratio of monosilane to the rare-gas ($SiH_4$/rare-gas) introduced into the deposition chamber is controlled to be 0.1/99.9 to 1/9, and a pressure within the deposition chamber is 1.333 Pa to 133.322 Pa, thereby deposition defects including peeing are prevented.

In each of the configurations, the metal element is one element or a plurality of elements selected from the group consisting of Fe, Ni, Co, Ru, Rh, Pd, Os, Ir, Pt, Cu, and Au. By providing the semiconductor film having an amorphous structure with the metal element, a good crystallization is achieved.

In the specification, the barrier layer is a layer having a property or thickness that enables transit of the metal element in the gettering process, and is a layer which acts as the etching stopper in the process for removing the layer to be the gettering site. The barrier layer is a silicon oxide film or silicon oxide-nitride film 1 nm to 10 nm in thickness.

In the invention, the process for forming the film to be the etching stopper or part of the gettering site (barrier layer) can be a process for oxidizing a surface of the crystallized semiconductor film (the semiconductor film having the crystal structure) by irradiating a laser light, then further oxidizing the surface of the crystallized semiconductor film in a solution containing ozone, or a process for oxidizing the surface of the crystallized semiconductor in the solution containing the ozone, or a process for oxidizing the surface of the crystallized semiconductor film by irradiating ultraviolet rays in an oxygen atmosphere. Another process for forming the barrier layer includes a process for oxidizing the surface of the crystallized semiconductor film by an oxygen plasma treatment (oxidization process using oxygen radicals). Another process for forming the barrier layer may include a process for forming the film by depositing an oxide film or oxide-nitride film about 1 nm to 10 nm thick by the plasma CVD method, the sputter method, or an evaporation method. As another process for forming the barrier layer, a thin oxide film can be formed on the surface of the crystallized semiconductor film by heating the film to about 200 to 350° C. using a clean oven. As another process for forming the barrier layer, any one or combination of the above formation methods can be used.

In each of the configurations, the rare-gas element is one or more kinds of members selected from the group consisting of He, Ne, Ar, Kr, and Xe. The rare-gas ion is contained in the semiconductor film, thereby a dangling bond or the lattice strain can be formed, leading to formation of the gettering site.

According to the invention, a crystallized semiconductor film in which a metal element helping the crystallization is sufficiently reduced or removed can be obtained, and in a TFT having the semiconductor film as an active layer, an improvement of electric properties, particularly, reduction of an OFF-state current, and reduction of variation among individual elements can be obtained.

The gettering can be performed fast and effectively by a heating treatment at 600° C. or more.

BRIEF DESCRIPTION OF THE DRAWINGS

FIG. 2 is a view showing a relationship between a Ni concentration in a polycrystal-Silicon surface after removing a gettering site and an Ar/Si intensity ratio in a gettering-site surface after the gettering, FIGS. 6A–6D are drawings showing cross sectional views for respective processes, FIGS. 7A–7C are drawings showing cross sectional views for respective processes, FIG. 9 is a plan view showing a liquid crystal display device.

DETAILED DESCRIPTION OF THE INVENTION

Description of the Preferred Embodiments

The preferred embodiment of the invention is described below.

Embodiment Mode

Hereinafter, a typical procedure for fabricating a TFT using the invention is briefly shown using FIGS. 1A–1H. Here, an example where a second semiconductor film and an oxynitride film on the second semiconductor film are deposited by the plasma CVD apparatus is shown.

Figure 1A:
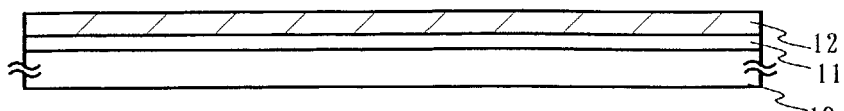
FIGS. 1A–1H are drawings depicting cross sectional views for respective processes showing an embodiment.

In FIG. 1A, reference numeral 10 is a substrate having an insulating surface, reference numeral 11 is an insulating film to be a blocking layer, and reference numeral 12 is a semiconductor film having an amorphous structure.

In FIG. 1A, as the substrate 10, a glass substrate, quartz substrate, and ceramic substrate can be used. A silicon substrate, metal substrate, or stainless steel substrate having a surface on which an insulating film is formed can be also used. A plastic substrate having a heat resistance resistant to a treatment temperature in this process can be also used.

First, the base insulating film 11 comprising a silicon oxide film, silicon nitride film, or silicon oxide-nitride film ($SiO_xN_y$) is formed on the substrate 10 as shown in FIG. 1A. In a typical example, a structure, in which the base insulating film 11 comprising a double layer structure is formed of a silicon oxynitride film formed 50 nm to 100 nm thick using $SiH_4$, $NH_3$, and $N_2O$ as reactant gases, and a silicon oxide-nitride film formed 100 nm to 150 nm thick using $SiH_4$ and $N_2O$ as the reactant gases in a stacked relationship, is employed. A silicon nitride film (SiN film) or silicon oxide-nitride film ($SiO_xN_y$ film) 10 nm or less in thickness is preferably used as one layer of the base insulating film 11. Since nickel is apt to move to a region with a high oxygen-concentration during gettering, it is extremely effective that the base insulating film contacting with the semiconductor film is the silicon nitride film. A triple layer structure in which the silicon oxynitride film, silicon oxide-nitride film, and silicon nitride film are stacked sequentially can be also used.

Then, the first semiconductor film 12 having the amorphous structure is formed on the base insulating film. For the first semiconductor film 12, a semiconductor material including silicon as a main component is used. Typically, an amorphous silicon film or amorphous silicon-germanium film is employed, which is formed 10 nm to 100 nm in thickness by the plasma CVD method, a low-pressure CVD method, or the sputter method. To obtain a semiconductor film having a high-quality crystal structure in a later crystallization, it is preferable that a concentration of impurity such as oxygen or nitrogen contained in the first semiconductor film 12 having the amorphous structure is reduced to $5 \times 10^{18}$/cm$^3$ (atomic concentration measured by secondary ion mass spectrometry (SIMS)) or less. The impurities become a factor for inhibiting the crystallization in the later process, in addition, become a factor for increasing a density of capture center or recombination center even after the crystallization. Therefore, it is desirable to use a CVD apparatus adapted for ultra-high vacuum having a mirror finish (electropolishing) surface within a reaction chamber or an oil-free vacuum pumping system, as well as to use a highly purified material gas.

Figure 1B:
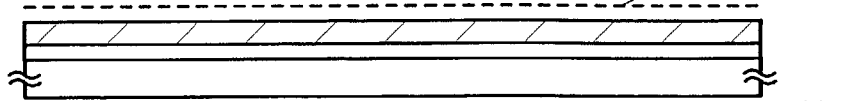

Then, as a technique for crystallizing the first semiconductor film 12 having the amorphous structure, a technique described in JP-A-8-78329 is used for the crystallization here. In the technique described in the JP-A-8-78329, the amorphous silicon film is selectively doped with a metal element that helps the crystallization, then a heating treatment is performed, thereby a semiconductor film having a crystal structure which extends starting from the added region is formed. First, on the surface of the first semiconductor film 12 having the amorphous structure, a nickel acetate salt solution which contains 1 ppm to 100 ppm by weight of metal element having a catalyst function (in this case, nickel) for accelerating the crystallization is coated by a spinner, thereby a nickel-containing layer 13 is formed (FIG. 1B). As a method for forming the nickel-containing layer 13 other than the coating, a method for forming an extremely thin film by the sputter method, the evaporation method, or a plasma treatment can be also used. Although an example where the coating is done on an entire surface is shown here, the nickel-containing layer can be selectively formed by forming a mask.

Figure 1C:
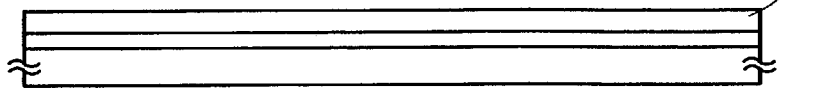

Then, a heating treatment is performed for the crystallization. In this case, in the crystallization, a silicide is formed in a portion of the semiconductor film to which the metal element helping the crystallization of the semiconductor contacts, and the crystallization progresses with a nuclear of the silicide. In this way, a first semiconductor film 14 having a crystal structure shown in FIG. 1C is formed. A concentration of oxygen contained in the first semiconductor film 14 after the crystallization is desirably $5 \times 10^{18}$/cm$^3$ or less. A heat treatment for the crystallization (550 to 650° C. for 4 to 24 hours) is performed after a heat treatment for dehydrogenation (450° C. for 1 hour) here. When the crystallization is performed by a strong light irradiation, although any one or combination of infrared light, visible light, or ultraviolet light can be used, typically, light emitted from a halogen lamp, metal halide lamp, xenon arc lamp, carbon arc lamp, high-pressure sodium lamp, or high-pressure mercury lamp is used. The lamp source may be heated by lighting the lamp for a required time, or by lightening the lamp for 1 to 60 seconds, preferably 30 to 60 seconds, and repeating the lighting 1 to 10 times until the semiconductor film is momentarily heated to about 600° C. to 1000° C. If required, a heat treatment for discharging hydrogen contained in the first semiconductor film 14 having the amorphous structure can be performed before irradiating the strong light. The heat treatment and irradiation of the strong light can be performed at the same time for the crystallization. In consideration of productivity, it is desirable that the crystallization is performed by the irradiation of the strong light.

In the first semiconductor film 14 obtained in this manner, the metal element (in this case, nickel) remains. The element remains at a concentration over $1 \times 10^{19}$/cm$^3$ on average, though the element may not distribute uniformly in the film. Naturally, although TFT and various other kinds of semiconductor elements can be formed even in such condition, that element is removed by the gettering method of the invention shown below.

Then, for increasing a crystallization ratio (ratio of crystal component in total volume of a film) to repair defects remained within a crystal grain, it is preferable to irradiate a laser light on the first semiconductor film 14 having the crystal structure. When the laser light is irradiated, a thin oxide film (not shown) is formed on a surface. As the laser light, an excimer laser light having a wavelength of 400 nm or less emitted from a pulse-oscillation, laser light source, or the second and third harmonics of a YAG laser can be used. A solid-state laser capable of continuous oscillation can be also used, where the second to fourth harmonics of a fundamental wave are usable. Typically, a second harmonic (532 nm) or third harmonic (355 nm) of Nd:YVO$_4$ laser (fundamental wave is 1064 nm) can be preferably used.

Figure 1D:
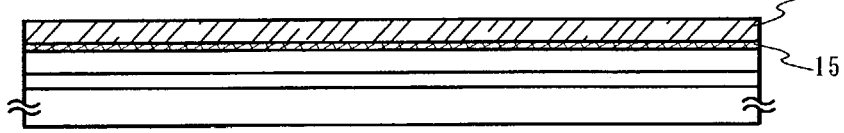

Since the oxide film formed by the laser light irradiation after the crystallization is insufficient, an oxide film (referred to as chemical oxide) is further formed in an ozonous solution (typically ozonous water), thereby a barrier layer 15 comprising an oxide film 1 nm to 10 nm in total thickness is formed. A second semiconductor film 16a containing the rare-gas element is formed on the barrier layer 15 (FIG. 1D).

Here, the oxide film formed when the laser light is irradiated to the first semiconductor film 14 having the crystal structure is also regarded as part of the barrier layer. The barrier layer 15 acts as an etching stopper when only the second semiconductor film 16 is selectively removed in a later process. The chemical oxide can be also formed through a treatment in a solution in which sulfuric acid, hydrochloric acid, or nitric acid is mixed with hydrogen peroxide solution in place of the ozonous solution. As another method for forming the barrier layer 15, the layer 15 can be also formed by generating ozone through irradiation of ultraviolet rays in an oxygen atmosphere, and oxidizing the surface of the semiconductor film having the crystal structure thereby. As another method for forming the barrier layer 15, an oxide film 1 nm to 10 nm in thickness can be deposited as the barrier layer by the plasma CVD method, sputter method, or evaporation method. As another method for forming the barrier layer 15, a thin oxide film can be formed by heating the semiconductor film to about 200 to 350° C. using a clean oven. The barrier layer 15 formed by any one or combination of the above methods needs to have a property or thickness where the nickel in the first semiconductor film can move into the second semiconductor film in the later gettering process.

The second semiconductor film 16a containing the rare-gas element on the barrier layer is formed by the plasma CVD method, or sputter method, and thus a gettering site 10 nm to 300 nm in thickness is formed. As the rare-gas element, one or some selected from helium (He), neon (Ne), argon (Ar), krypton (Kr), and xenon (Xe) may be used. In particular, argon (Ar), an economical gas, is preferable.

The plasma CVD method is used for the deposition here, where the monosilane and argon are used as source gases, and a ratio of monosilane to argon is controlled to be 0.1/99.9 to 1/9, preferably 1/99 to 5/95. A RF power density during deposition is desirably to be 0.0017 W/cm$^2$ to 0.48 W/Cm$^2$. The higher the RF power density the better, because a deposition rate becomes higher. A pressure during deposition is desirably to be 1.333 Pa (0.01 Torr) to 133.322 Pa (1 Torr), preferably less than 53.32 Pa (0.4 Torr). The higher the pressure the better, because the deposition rate becomes higher. A deposition temperature is desirably to be 300° C. to 500° C. In this way, the second semiconductor film, which has an argon concentration of $1\times10^{18}/cm^3$ to $1\times10^{22}/cm^3$, preferably $1\times10^{20}/cm^3$ to $1\times10^{21}/cm^3$ and thus provides a gettering effect, can be deposited by the plasma CVD method. In addition, by the above deposition conditions of the second semiconductor film, damage to the barrier layer can be reduced, and defects such as a thickness variation of the first semiconductor film and a hole formation in the first semiconductor film can be prevented.

There are two purposes for adding an ion of the rare-gas element that is an inert gas in the film. One is for forming a dangling bond to give a strain in the semiconductor film, and the other is for giving a strain among lattices of the semiconductor film. When an element having a larger atomic radius than that of silicon such as argon (Ar), krypton (Kr), or xenon (Xe) is used, the strain among the lattices of the semiconductor film can be obtained significantly. The presence of the rare-gas element in the film forms not only the lattice strain, but also an unpaired bond hand, which also helps the gettering action.

Figure 1E:
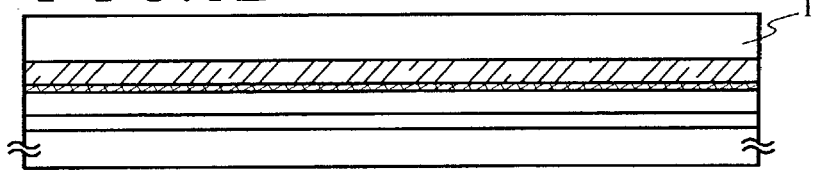

Then, an anti-diffusion film 1 (in this case, silicon oxynitride film) for preventing diffusion of the rare-gas element (in this case, argon) is formed on the second semiconductor film (FIG. 1E). In this case, a silicon oxynitride film (percent composition is 32% of Si, 27% of O, 24% of N, and 17% of H) made by the plasma CVD method where the deposition temperature is 400° C. and the source gases are $SiH_4$, $NH_3$, and $N_2O$ is formed 50 nm (preferably 10 nm to 300 nm) thick.

Figure 1F:
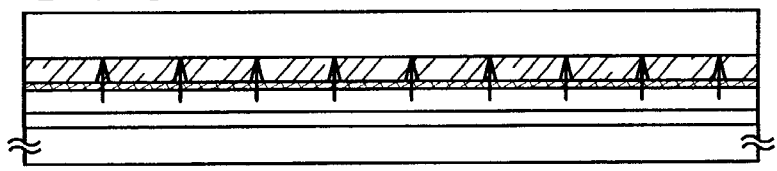

After depositing the anti-diffusion film 1, a heating treatment is performed, and thus the getting for reducing the concentration of the metal element (nickel) in the first semiconductor film or removing the element, is performed (FIG. 1F). As the heating treatment for the gettering, the heating can be performed by a strong light irradiation, by a heat treatment using an oven, or by charging a substrate in a heated gas atmosphere, and keeping there for several minutes, and then taking out from there. By the gettering, the metal element is moved along arrow direction in FIG. 1F (that is, a direction from a substrate side to a surface of the second semiconductor film), and thus removal of the metal element contained in the first semiconductor film 14 covered by the barrier layer 15, or reduction of the concentration of the metal element is achieved. The distance that the metal element is moved during the gettering may be a distance nearly equal to the thickness of the first semiconductor film, and thus the gettering can be completed within a comparatively short time. Here, the gettering is sufficiently carried out such that all nickel is moved into the second semiconductor film 16 to avoid segregation of the nickel in the first semiconductor film 14, and almost no nickel is contained in the first semiconductor film 14, or the nickel concentration in the film is $1\times10^{18}/cm^3$ or less, desirably $1\times10^{17}/cm^3$ or less. The barrier layer 15, in addition to the second semiconductor film, also acts as the gettering site.

In a certain condition of the heating treatment for the gettering, or in a certain thickness of the second semiconductor film, part of the second semiconductor film may be crystallized in some cases. By forming the anti-diffusion film 1, the crystallization of the second semiconductor film can be prevented. Therefore, the gettering can be performed without being limited by the temperature of the heating treatment or the thickness of the second semiconductor film. The crystallization of the second semiconductor film causes reduction of an amount of the dangling bond, lattice strain, and unpaired bond hand, resulting in reduction of the gettering effect. In any case, the second semiconductor film, or the amorphous silicon film containing the rare-gas element, is most suitable for the gettering site, because it is hard to crystallize compared with the amorphous silicon film containing no rare-gas element.

In a certain condition of the heating treatment of the gettering, repair of the defects remained within the crystal grain, or improvement of crystallinity can be achieved together with the gettering.

In the specification, the gettering is a phenomenon that a metal element in a gettered region (in this case, the first semiconductor film) is discharged by a thermal energy, and moved into a gettering site by diffusion. Therefore, the gettering has dependence on treatment temperature, or the higher the temperature the faster the gettering proceeds. There has been a possibility that a high heating treatment temperature for the gettering causes the crystallization of the semiconductor film having the amorphous structure to be the gettering site, resulting in reduction of gettering efficiency. However, by providing the anti-diffusion film, increase of the temperature of the heating treatment and decrease of the thickness of the semiconductor film are enabled.

When the treatment of the strong light irradiation is used, the irradiation may be performed continuously within a range where the substrate can resist to the irradiation, for example, a lamp source for heating is lighten for about 3 minutes so that the semiconductor film is momentarily heated to 700° C. Alternatively, the lamp source for heating is lighten for 1 to 60 seconds, preferably 30 to 60 seconds, and the heating is repeated 1 to 10 times, preferably 2 to 6 times. Although an emission intensity of the lamp source may be arbitrary, it is designed that the semiconductor film is momentarily heated to 600° C. to 1000° C., preferably about 700° C. to 750° C.

When the heating is performed by the heat treatment, it is better to perform a heat treatment at 450 to 800° C. for 1 to 24 hours, for example, 550° C. for 4 hours in an inert gas atmosphere, typically in a nitrogen atmosphere. When the substrate is charged in an oven previously heated to 450° C. to 800° C., it is better to perform the heat treatment by keeping the substrate in the oven heated to, for example, 700° C. for 3 minutes. A strong light may be irradiated in addition to the heat treatment.

Figure 1G:
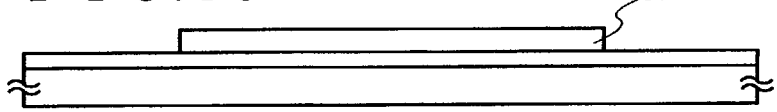

Then, after removing the anti-diffusion film 1, only the second semiconductor film shown as 16 is selectively removed using the barrier layer 15 as the etching stopper, and then the barrier layer 15 is removed, and then the first semiconductor film 14 is patterned using a known patterning technique, and thus a semiconductor layer 17 having a desired pattern is formed (FIG. 1G). The method for selectively etching the second semiconductor film only can be implemented by a dry etching without using a $ClF_3$ plasma or a wet etching in an alkaline solution such as hydrazine, or an aqueous solution containing tetramethylammoniumhydrooxide (chemical formula is $(CH_3)_4NOH$.) After the second semiconductor film was removed, a surface of the barrier layer was examined to measure a nickel concentration by TXRF, as a result a high concentration of nickel was detected, therefore the barrier layer is desirably removed. An etchant containing a hydrofluoric acid can be used to remove the layer. After removing the barrier layer, it is desirable to form a thin oxide film on a surface using the ozone water before forming a mask made of resist.

After completing a process for forming a semiconductor layer 17 having a desired pattern, a surface of the semiconductor layer is cleaned by the etchant containing the hydrofluoric acid, thereby an insulating film to be a gate insulating film 18 having silicon as a main component is formed. It is desirable that the cleaning of the surface and formation of the gate insulating film are carried out successively without exposing to the atmosphere.

Then, after cleaning the surface of the gate insulating film 18, a gate electrode 19 is formed. Then, with an impurity element (for example, P or As) for imparting an n-type property to the semiconductor, phosphorous in this case, the semiconductor is properly doped, thereby a source region 20 and drain region 21 are formed. After adding, a heating treatment, an irradiation of a strong light, or an irradiation of a laser light is performed for activating the impurity element. A plasma damage to the gate insulating film or a plasma damage to an interface between the gate insulating film and semiconductor layer can be recovered together with the activation. Particularly, it is very effective that the impurity element is activated by irradiating the second harmonic of the YAG laser from a topside or backside in an atmosphere from a room temperature to 300° C. The YAG laser is a preferable activation method, because a frequent maintenance is not required.

Figure 1H:
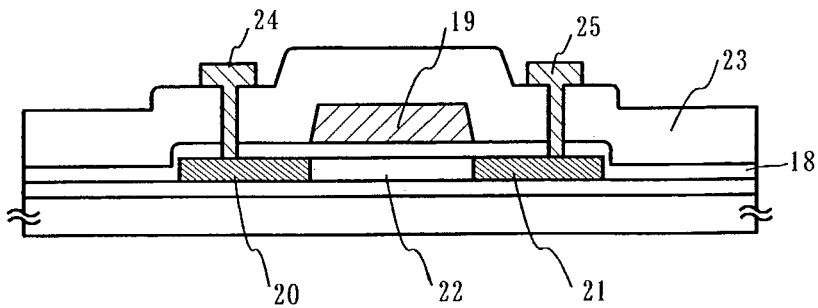

In a following process, an interlayer isolation film 23 is formed, a hydrogenation is performed, a contact hole leading to a source region or drain region is formed respectively, then a source electrode 24 and drain electrode 25 are formed, thereby a TFT (n-channel-type TFT) is completed (FIG. 1H).

A concentration of the metal element contained in a channel-forming region 22 of the TFT obtained in this way can be less than $1 \times 10^{17}/cm^3$.

The invention, which is not limited to the TFT structure of FIG. 1H, may be a lightly doped drain (LDD: Lightly Doped Drain) structure having a LDD region between the channel-forming region and drain region (or source region). The structure is a structure in which a region lightly doped with the impurity element is provided between the channel-forming region and the source region or drain region formed by heavily doping with the impurity element. The lightly doped region is referred to as the LDD region. Further, the structure may be a so-called GOLD (Gate-drain Overlapped LDD) structure where the LDD region is arranged in an overlapped manner with the gate electrode through the gate insulating film.

Although a description was made using an n-channel-type TFT here, it will be appreciated that a p-channel-type TFT can be formed by using a p-type impurity element in place of an n-type impurity element.

Although a description was made using a top-gate-type TFT as an example here, the invention can be used irrespective of the TFT structure, for example, it can be used for a bottom-gate-type (backward-stagger-type) TFT or forward-stagger-type TFT.

Although an example using a semiconductor film containing a rare-gas element was shown here, a semiconductor film that further contains a phosphorous element may be also used, or a semiconductor film containing the phosphorous element and rare-gas element may be also used in place of the semiconductor film containing the rare-gas element. When the semiconductor film containing the phosphorous element and rare-gas element is formed, the phosphine can be added in a deposition gas. For example, the monosilane, phosphine ($PH_3$), and argon can be used for the deposition.

Here, an experiment below was conducted to confirm the gettering effect of the anti-diffusion film.

Hereinafter, a fabrication procedure of a sample is shown. First, according to the process, a silicon oxynitride film having a thickness of 50 nm and a silicon oxide-nitride film having a thickness of 100 nm are formed in a staked manner on a glass substrate (AN100) by the plasma CVD method, then an amorphous silicon film having a thickness of 54 nm is formed as the first semiconductor film. Then, according to the process, a nickel acetate salt solution containing 100 ppm of nickel is coated by the spinner, then a heat treatment is carried out at 500° C. for 1 hour, and then a heat treatment is performed at 550° C. for 4 hour, thereby the semiconductor film is crystallized. Then, according to the process, a pulse-oscillation, excimer laser light is irradiated for improving a crystallization ratio. Then, in addition to the oxide film formed by the irradiation of the excimer laser light, the surface is further oxidized in the ozone water, as a result an oxide film to be the barrier layer having a total thickness of 1 nm to 10 nm is formed.

On the barrier layer, an amorphous silicon film having a thickness of 50 nm was deposited as the second semiconductor film by the sputter method using a silicon target in an argon atmosphere. As samples, a sample of the amorphous silicon film (50 nm) only, a sample having a silicon oxynitride film (in the specification, referred to as SiNO film) 150 nm in thickness formed as the anti-diffusion film on the amorphous silicon film (50 nm), and a sample having a silicon oxide-nitride film (in the specification, referred to as SiON film) 150 nm in thickness formed as the anti-diffusion film on the amorphous silicon film (50 nm) are prepared. Here, the SiON film is a film that is made using the plasma CVD where the deposition temperature is 400° C., and the source gases are $SiH_4$ and $N_2O$ (percentage composition is 32% of Si, 59% of O, 7% of N, and 2% of H.)

Figure 3:
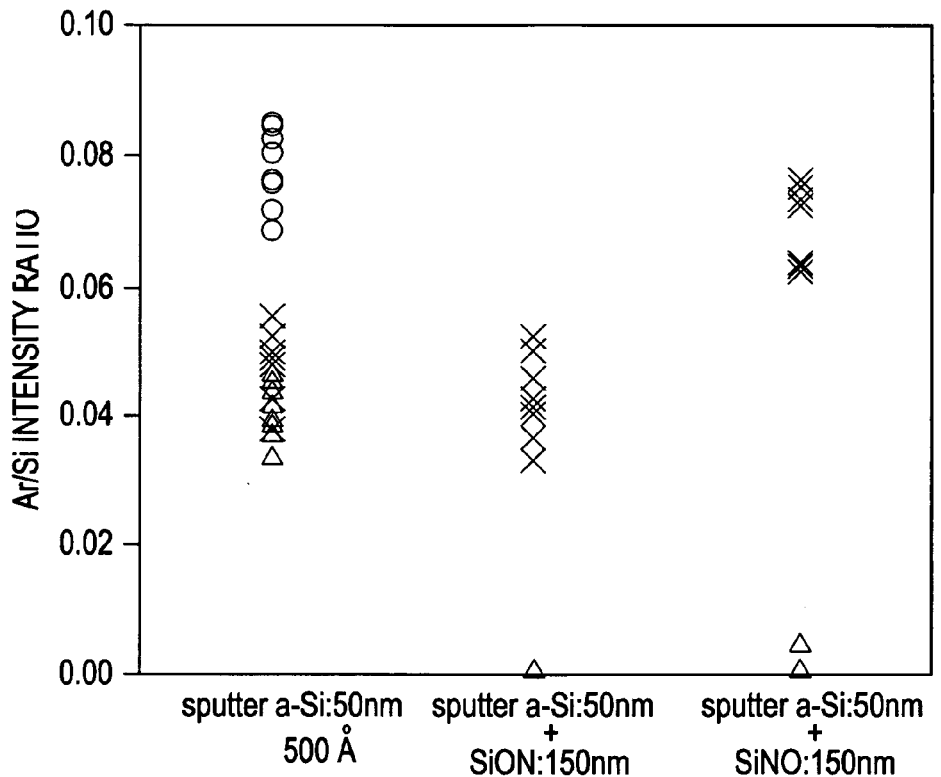
FIG. 3 is a view showing the Ar/Si intensity ratio in a sample surface.

Then, a heat treatment was carried out and thus the gettering was performed. As the heat treatment, each sample was charged in an oven and heated to 650° C. in 210 seconds, then kept there for 5 minutes, and then taken out. An Ar concentration near to the surface was measured for each sample using the TXRF after the gettering, and the results are indicated by a symbol of open triangle in FIG. 3. No argon is detected on the surface of the anti-diffusion film as shown in FIG. 3, which shows that both the silicon oxynitride film (SiNO film) and the silicon oxide-nitride film (SiON film) are capable of blocking argon.

Then, a wet etching or dry etching to the sample in which the anti-diffusion film was formed, thereby the anti-diffusion film was removed. A 5% diluted dilute hydrofluoric acid (1/10 HF) was used to remove the film here. An Ar concentration near to the surface of the second semiconductor film was measured for each sample using the TXRF after removing the anti-diffusion film, and the results are indicated by a symbol of cross in FIG. 3. It can be seen that while the Ar concentration in the sample in which the SiON film was formed is nearly equal to that of the sample without the anti-diffusion film, and the Ar concentration is reduced about 40% compared with before removing the anti-diffusion film, the Ar concentration is high in the sample in which the SiNO film was formed compared with other samples, and the Ar concentration in the second semiconductor film is reduced only about 10% compared with before removing the anti-diffusion film.

Figure 4:
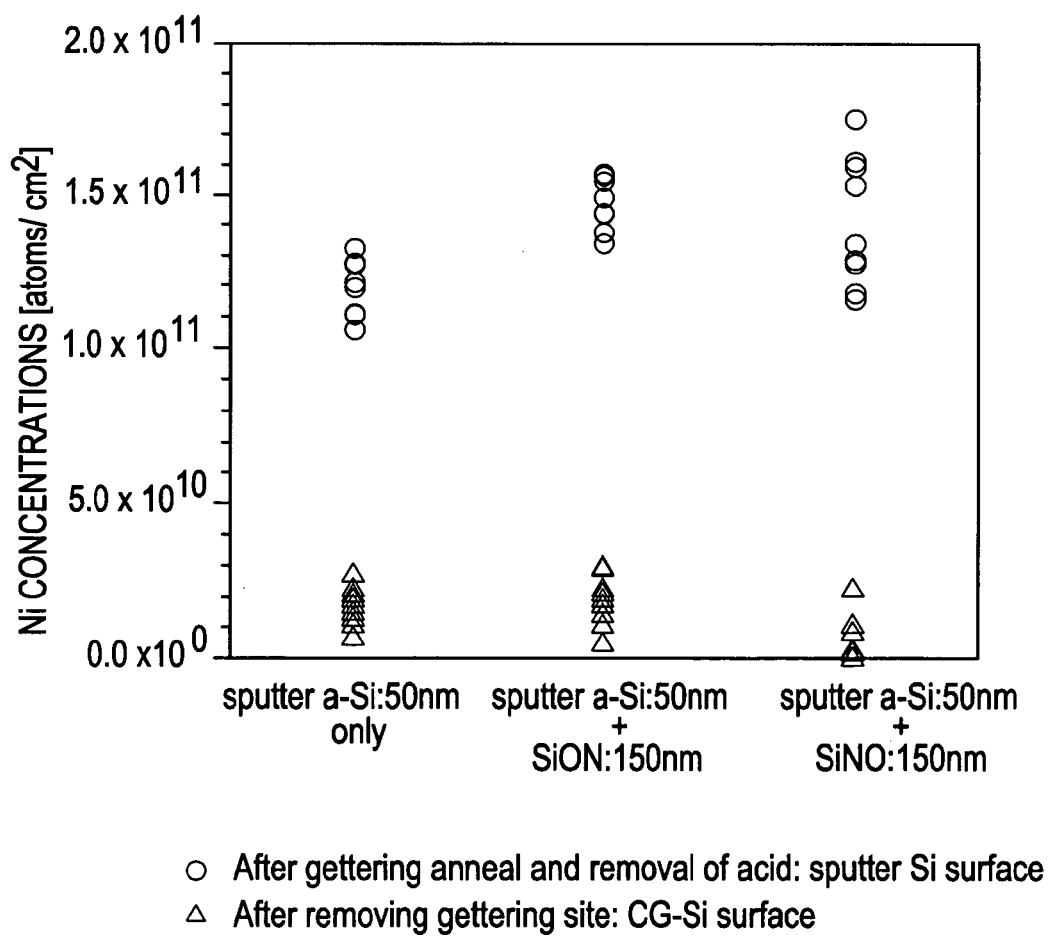
FIG. 4 is a view showing respective Ni concentrations in the surface after removing an anti-diffusion film and after removing the gettering site.

A Ni concentration near to the surface of the second semiconductor film was measured for each sample using the TXRF after removing the anti-diffusion film, and the results are indicated by a symbol of open circle in FIG. 4.

Finally, the second semiconductor film was selectively removed by an alkaline etchant solution (typically an etchant comprising an aqueous solution that contains 2.38% of tetramethylammoniumhydrooxide (chemical formula is $(CH_3)_4NOH$), TMAH, and is heated to 50° C.), and the barrier layer was removed by the dilute hydrofluoric acid, and then a Ni concentration near to the surface of the first semiconductor film was measured for each sample using the TXRF. The results are indicated by a symbol of open triangle in FIG. 4.

In FIG. 4, in the sample in which the SiNO film was formed as the anti-diffusion film, the Ni concentration near to the surface of the first semiconductor film was significantly reduced, particularly in some points, no nickel was detected. From the results, it can be said that the gettering effect is most significant when the SiNO film is formed as the anti-diffusion film.

In FIG. 2, a relationship between an Ar/Si intensity ratio on the surface of the second semiconductor film after removing the anti-diffusion film and the Ni concentration on the surface of the first semiconductor film after removing the second semiconductor film is shown. It can be said that the Ni concentration on the surface of the first semiconductor film tends to decrease when the Ar concentration after the gettering increases.

Figure 5A:
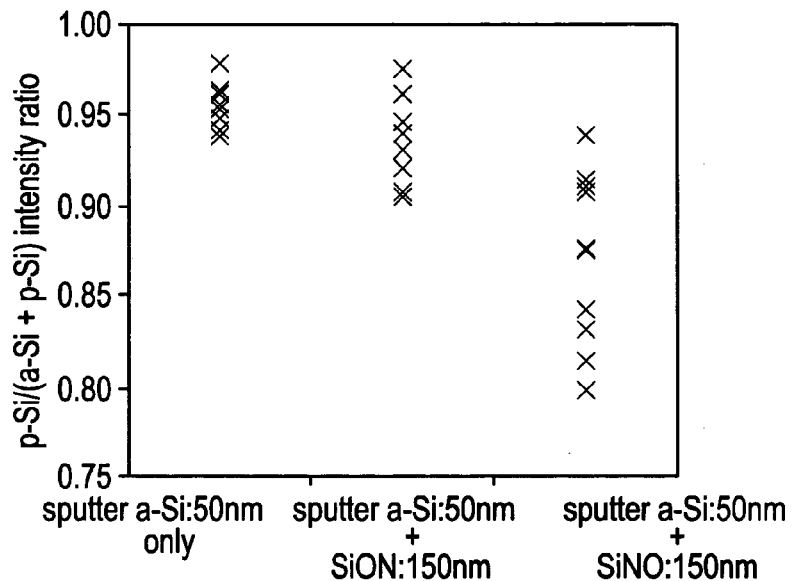
FIG. 5A is a drawing including a view showing a crystallization ratio.
Figure 5B:
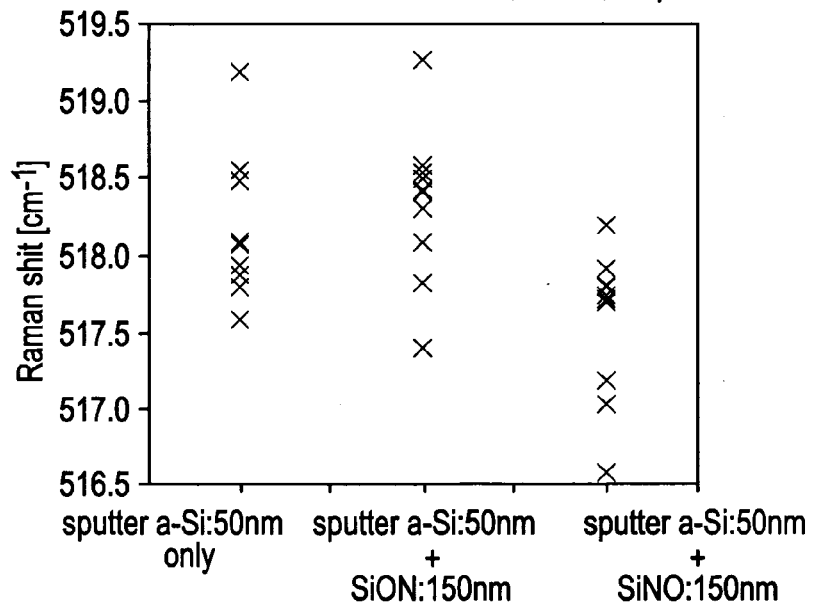
FIG. 5B is a view showing a Raman shift.

Raman optical characteristic was examined regarding a crystal condition after the gettering (for the second semiconductor film). FIG. 5B shows the Raman optical characteristic. FIG. 5A shows the crystallization ratio (ratio of crystal) obtained from a TO mode intensity of the amorphous silicon and a TO mode intensity of the crystal silicon. The Raman measurement data, which is a measurement result about the stacked structure of the first semiconductor film and second semiconductor film, includes a data from the underlayer, first semiconductor film, therefore the data is not a data only from the second semiconductor layer, however, it can be seen that the sample having the SiNO film formed as the anti-diffusion film has a low crystallization ratio compared with other samples.

From the experimental results, it can be said that when the SiNO film is formed on the second semiconductor film, an out diffusion of Ar occurred during the gettering (heating treatment) can be prevented, therefore the gettering ability of the second semiconductor film can be maintained, and thus the Ni concentration in the first semiconductor film can be at a extremely low level.

It has been also found from the experiments that a heat treatment after forming the SiNO film on the second semiconductor film makes an amount of substrate-warp large. That is, the large amount of the substrate warp means that a film stress, in this case a tensile stress, is large. The tensile stress exerts also on the gettering site (the second semiconductor film), thereby strain in the gettering site increases, leading to improvement of the gettering ability. Noting the optical characteristic of the gettering site (FIG. 5A, FIG. 5B), it can be seen that in the sample having the SiNO film formed as the anti-diffusion film, while the crystallization ratio is low compared with other samples, Raman shift is small, that is, the tensile stress exerts on the gettering site.

The invention comprising the above configuration is further described in detail using following embodiments.

EMBODIMENT 1

Embodiments of the present invention will be described with reference to FIGS. 6A to 8. Here, description in detail will be given on a method of fabricating a pixel portion and TFTs (an n-channel TFT and a p-channel TFT) of a driving circuit provided in the periphery of the pixel portion on the same substrate at the same time.

First, a base insulating film 101 is formed on a substrate 100. After a first semiconductor film having a crystal structure is obtained, the film is etched into desired shapes to form semiconductor layers 102 to 106 that are separated from one another like islands.

A glass substrate (#1737) is used as the substrate 100, for the base insulating film 101, a silicon oxynitride film 101a with a thickness of 50 nm (preferably 10 to 200 nm) is formed by a plasma CVD method at 400° C. using $SiH_4$, $NH_3$, and $N_2O$ as material gas. Next, a silicon oxynitride film 101b with a thickness of 100 nm (preferably 50 to 200 nm) is formed by a plasma CVD method at 400° C. using $SiH_4$ and $N_2O$ as material gas and laid on 101a. Then a semiconductor film having an amorphous structure (here an amorphous silicon film) is formed by a plasma CVD method at 300° C. using $SiH_4$ as material gas to a thickness of 54 nm (preferably 25 to 80 nm).

The base film 101 in this embodiment has a two-layer structure but it may be a single layer or two or more layers of the above insulating films. The material of the semiconductor film is not limited but silicon, a silicon germanium ($Si_xGe_{1-x}$ (X=0.0001 to 0.02)) alloy, or the like is preferred and these may be formed into a film by a known method (sputtering, LPCVD, a plasma CVD method, or the like).

In this embodiment, the base insulating film 101 is shown in a form of a two-layer structure, but a single layer of the insulating film or a structure in which two or more layers thereof are laminated may be adopted. Further, there is no limitation on the material of the semiconductor film. However, the semiconductor film may be preferably formed of silicon or silicon germanium ($Si_{1-x}Ge_x$ (X=0.0001 to 0.02)) alloy by using a known means (sputtering, LPCVD, a plasma CVD method, or the like). Further, a plasma CVD method apparatus may be a single wafer type one or a batch type one. In addition, the base insulating film and the semiconductor film may be continuously formed in the same film formation chamber without exposure to an atmosphere.

Subsequently, after the surface of the semiconductor film having an amorphous structure is cleaned, an extremely thin oxide film with a thickness of about 2 nm is formed from ozone water on the surface. Then, in order to control a threshold value of a TFT, doping of a minute amount of impurity element (boron or phosphorous) is performed. Here, an ion doping method is used in which diborane ($B_2H_6$) is plasma-excited without mass-separation, and boron is added to the amorphous silicon film under the doping conditions: an acceleration voltage of 15 kV; a gas flow rate of diborane diluted to 1% with hydrogen of 30 sccm; and a dosage of $2 \times 10^{12}/cm^2$.

Then, a nickel acetate salt solution containing nickel of 10 ppm in weight is applied using a spinner. Instead of the application, a method of spraying nickel elements to the entire surface by sputtering may also be used.

Then, a heat treatment is conducted to perform crystallization, thereby forming a semiconductor film having a crystal structure. A heating process using an electric furnace or irradiation of strong light may be conducted for this heat treatment. In case of the heating process using an electric furnace, it may be conducted at 500 to 650° C. for 4 to 24 hours. Here, after the heating process (500° C. for 1 hour) for dehydrogenation is conducted, the heating process (550° C. for 4 hours) for crystallization is conducted, thereby obtaining a silicon film having a crystal structure. Note that, although crystallization is performed by using the heating process using a furnace, crystallization may be performed by means of a lamp annealing apparatus. Also note that, although a crystallization technique using nickel as a metal element that helps crystallization of silicon is used here, other known crystallization techniques, for example, a solid-phase growth method and a laser crystallization method, may be used.

Next, after the oxide film on the surface of the silicon film having a crystal structure is removed by dilute hydrofluoric acid or the like, irradiation of the laser light (XeCl: wavelength of 308 nm) for raising a crystallization rate and repairing defects remained in crystal grains is performed in an atmosphere or in an oxygen atmosphere. Excimer laser light with a wavelength of 400 nm or less, or second harmonic wave or third harmonic wave of a YAG laser is used for the laser light. In any case, pulse laser light with a repetition frequency of approximately 10 to 1000 Hz is used, the pulse laser light is condensed to 100 to 500 mJ/cm$^2$ by an optical system, and irradiation is performed with an overlap ratio of 90 to 95%, whereby the silicon film surface may be scanned. Here, the irradiation of the first laser light is performed in an atmosphere with a repetition frequency of 30 Hz and energy density of 470 mJ/cm$^2$. Note that an oxide film is formed on the surface by the first laser light irradiation since the irradiation is conducted in an atmosphere or in an oxygen atmosphere. Though an example of using the pulse laser is shown here, the continuous oscillation laser may also be used. When a crystallization of an amorphous semiconductor film is conducted, it is preferable that the second harmonic through the fourth harmonic of basic waves is applied by using the solid state laser which is capable of continuous oscillation in order to obtain a crystal in large grain size. Typically, it is preferable that the second harmonic (with a thickness of 532 nm) or the third harmonic (with a thickness of 355 nm) of an Nd:YVO$_4$ laser (basic wave of 1064 nm) is applied. Specifically, laser beams emitted from the continuous oscillation type YVO$_4$ laser with 10 W output is converted into a harmonic by using the non-linear optical elements. Also, a method of emitting a harmonic by applying crystal of YVO$_4$ and the non-linear optical elements into a resonator can be given. Then, more preferably, the laser beams are formed so as to have a rectangular shape or an elliptical shape by an optical system, thereby irradiating a substance to be treated. At this time, the energy density of approximately 0.01 to 100 MW/cm$^2$ (preferably 0.1 to 10 MW/cm$^2$) is required. The semiconductor film is moved at approximately 10 to 2000 cm/s rate relatively corresponding to the laser beams so as to irradiate the semiconductor film.

The oxide film formed by this laser light irradiation and an oxide film formed by treating the surface with ozone water for 120 seconds together make a barrier layer that has a thickness of 1 to 5 nm in total. Though the barrier layer is formed by using ozone water here, another method such as ultraviolet light irradiation performing in an oxygen atmosphere or oxide plasma treatment to oxidize the surface of the semiconductor film having the crystal structure may be used. In addition, as another method for forming the barrier layer, an oxide film having a thickness of about 1 nm to 10 nm may be deposited by a plasma CVD method, a sputtering method, an evaporation method, or the like. Further, before forming the barrier layer, the oxide film formed by laser light irradiation may be removed.

On the barrier layer, an amorphous silicon film containing argon elements are formed to a thickness of 10 to 400 nm, in this embodiment, 50 nm by sputtering to serve as a gettering site, an anti-diffusion film (film thickness of 1 nm to 300 nm) is formed then. In this Embodiment, an amorphous silicon film containing argon is formed under an atmosphere containing argon with using a silicon target. When the a plasma CVD method is used for forming an amorphous silicon film containing argon, it is formed under conditions where a flow ratio of monosilane to argon is controlled to be 1/99; a pressure during deposition to be 6.665 Pa (0.05 Torr); a RF power density during deposition to be 0.087 W/cm$^2$; a deposition temperature to be 350° C.

Further, in this Embodiment, as the anti-diffusion film, used is a silicon oxynitride film (percent composition is 32% of Si, 27% of O, 24% of N, and 17% of H) made by a plasma CVD method where the deposition temperature is 400° C. and the source gases are SiH$_4$, NH$_3$, and N$_2$O.

Then, an oven heated at 650° C. is used for a heat treatment for 3 minutes for gettering to reduce the nickel concentration in the semiconductor film having a crystal structure. A lamp annealing apparatus may be used instead of the oven.

Subsequently, a 5% diluted dilute hydrofluoric acid (1/10 HF) is used to remove the anti-diffusion film, then, the amorphous silicon film containing the argon element, which is the gettering site, is selectively removed with the barrier layer as an etching stopper, and then, the barrier layer is selectively removed by dilute hydrofluoric acid. Note that there is a tendency that nickel is likely to move to a region with a high oxygen concentration in gettering, and thus, it is desirable that the barrier layer comprised of the oxide film is removed after gettering.

Then, after a thin oxide film is formed from ozone water on the surface of the obtained silicon film having a crystal structure (also referred to as polysilicon film), a mask made of resist is formed, and an etching process is conducted thereto to obtain a desired shape, thereby forming the island-like semiconductor layers separated from one another. After the formation of the semiconductor layers, the mask made of resist is removed.

Then, the oxide film is removed with the etchant containing hydrofluoric acid, and at the same time, the surface of the silicon film is cleaned. Thereafter, an insulating film containing silicon as its main constituent, which becomes a gate insulating film 303 is formed. In this embodiment, a silicon oxynitride film (composition ratio: Si=32%, O=59%, N=7%, H=2%) is formed with a thickness of 115 nm by a plasma CVD method.

Next, as shown in FIG. 6A, on the gate insulating film 107, a first conductive film 108*a* with a thickness of 20 to 100 nm and a second conductive film 108*b* with a thickness of 100 to 400 nm are formed in lamination. In this embodiment, a 50 nm thick tantalum nitride film and a 370 nm thick tungsten film are sequentially laminated on the gate insulating film 107.

As a conductive material for forming the first conductive film and the second conductive film, an element selected from the group consisting of Ta, W, Ti, Mo, Al and Cu, or an alloy material or a compound material containing the above element as its main constituent is employed. Further, a semiconductor film typified by a polycrystal silicon film doped with an impurity element such as phosphorous, or an AgPdCu alloy may be used as the first conductive film and the second conductive film. Further, the present invention is not limited to a two-layer structure. For example, a three-layer structure may be adopted in which a 50 nm thick tungsten film, an alloy film of aluminum and silicon (Al—Si) with a thickness of 500 nm, and a 30 nm thick titanium nitride film are sequentially laminated. Moreover, in case of a three-layer structure, tungsten nitride may be used in place of tungsten of the first conductive film, an alloy film of aluminum and titanium (Al—Ti) may be used in place of the alloy film of aluminum and silicon (Al—Si) of the second conductive film, and a titanium film may be used in place of the titanium nitride film of the third conductive film. In addition, a single layer structure may also be adopted.

Next, resist masks 110 to 115 are formed by a light exposure process as shown in FIG. 6B. Then a first etching treatment is conducted for forming gate electrodes and wires. The first etching treatment employs first and second etching conditions. ICP (inductively coupled plasma) etching is preferred for the etching. The films can be etched to have desired taper shapes by using ICP etching and suitably adjusting the etching conditions (the amount of power applied to a coiled electrode, the amount of power applied to an electrode on the substrate side, the temperature of the electrode on the substrate side, etc.). For etching gas, a suitable one can be chosen from chlorine-based gas, typically, $Cl_2$, $BCl_3$, $SiCl_4$, or $CCl_4$, fluorine-based gas, typically, $CF_4$, $SF_6$, or $NF_3$, and $O_2$.

In this embodiment, RF (13.56 MHz) power of 150 W is applied also to the substrate (sample stage) to substantially apply a negative self-bias voltage. The electrode area to the substrate side is 12.5 cm×12.5 cm, and the coil-shape electrode area (quartz disc formed coil is described here) is 25 cm diameter disc. The W film is etched so as to make end portions of the first conductive layer in taper shape in the first etching conditions. Under the first etching conditions, an etching rate to W is 200.39 nm/min, an etching rate to TaN is 80.32 nm/min, and a selection ratio of W to TaN is about 2.5. Further, with the first etching conditions, a taper angle of W is approximately 26°. Thereafter, the first etching conditions are changed to the second etching conditions without removing the masks 110 to 115 made of resist. $CF_4$ and $Cl_2$ are used as etching gases, the flow rate of the gases is set to 30/30 sccm, and RF (13.56 MHz) power of 500 W is applied to a coil-shape electrode with a pressure of 1 Pa to generate plasma, thereby performing etching for about 30 seconds. RF (13.56 MHz) power of 20 W is also applied to the substrate side (sample stage) to substantially apply a negative self-bias voltage. Under the second etching conditions in which $CF_4$ and $Cl_2$ are mixed, both the W film and the TaN film are etched at the same level. With the second etching conditions, an etching rate to W is 58.97 nm/min, and an etching rate to TaN is 66.43 nm/min. Note that an etching time may be increased by 10 to 20% in order to conduct etching without remained residue on the gate insulating film.

In the first etching process as described above, the shape of the mask made of resist is made appropriate, whereby the end portion of the first conductive layer and the end portion of the second conductive layer each have a tapered shape due to the effect of the bias voltage applied to the substrate side. The angle of the tapered portion is sufficiently set to 15° to 45°.

Thus, first shape conductive layers 117 to 121 composed of the first conductive layer and the second conductive layer (first conductive layers 117a to 121a and second conductive layers 117b to 121b) are formed by the first etching process. The insulating film 107 that becomes the gate insulating film is etched by approximately 10 to 20 nm, and becomes a gate insulating film 116 in which regions which are not covered by the first shape conductive layers 117 to 121 are thinned.

Next, a second etching process is conducted without removing the masks made of resist. Here, $SF_6$, $Cl_2$ and $O_2$ are used as etching gases, the flow rate of the gases is set to 24/12/24 sccm, and RF (13.56 MHz) power of 700 W is applied to a coil-shape electrode with a pressure of 1.3 Pa to generate plasma, thereby performing etching for 25 seconds. RF (13.56 MHz) power of 10 W is also applied to the substrate side (sample stage) to substantially apply a negative self-bias voltage. In the second etching process, an etching rate to W is 227.3 nm/min, an etching rate to TaN is 32.1 nm/min, a selection ratio of W to TaN is 7.1, an etching rate to SiON that is the insulating film 116 is 33.7 nm/min, and a selection ration of W to SiON is 6.83. In the case where $SF_6$ is used as the etching gas, the selection ratio with respect to the insulating film 116 is high as described above. Thus, reduction in the film thickness can be suppressed. In this embodiment, the film thickness of the insulating film 116 is reduced by only about 8 nm.

By the second etching process, the taper angle of W becomes 70°. By the second etching process, second conductive layers 124b to 129b are formed. On the other hand, the first conductive layers are hardly etched to become first conductive layers 124a to 129a. Note that the first conductive layers 124a to 129a have substantially the same size as the first conductive layers 117a to 121a. In actuality, the width of the first conductive layer may be reduced by approximately 0.3 μm, namely, approximately 0.6 μm in the total line width in comparison with before the second etching process. There is almost no change in size of the taper of the first conductive layer.

Further, in the case where, instead of the two-layer structure, the three-layer structure is adopted in which a 50 nm thick tungsten film, an alloy film of aluminum and silicon (Al—Si) with a thickness of 500 nm, and a 30 nm thick titanium nitride film are sequentially laminated, under the first etching conditions of the first etching process in which: $BCl_3$, $Cl_2$ and $O_2$ are used as raw material gases; the flow rate of the gases is set to 65/10/5 (sccm); RF (13.56 MHz) power of 300 W is applied to the substrate side (sample stage); and RF (13.56 MHz) power of 450 W is applied to a coil-shape electrode with a pressure of 1.2 Pa to generate plasma, etching is performed for 117 seconds. As to the second etching conditions of the first etching process, $CF_4$, $Cl_2$ and $O_2$ are used, the flow rage of the gases is set to 25/25/10 sccm, RF (13.56 MHz) power of 20 W is also applied to the substrate side (sample stage); and RF (13.56 MHz) power of 500 W is applied to a coil-shape electrode with a pressure of 1 Pa to generate plasma. With the above conditions, it is sufficient that etching is performed for about 30 seconds. In the second etching process, $BCl_3$ and $Cl_2$ are used, the flow rate of the gases are set to 20/60 sccm, RF (13.56 MHz) power of 100 W is applied to the substrate side (sample stage), and RF (13.56 MHz) power of 600 W is applied to a coil-shape electrode with a pressure of 1.2 Pa to generate plasma, thereby performing etching.

Next, the masks made of resist are removed, and then, a first doping process is conducted to obtain the state of FIG. 6D. The doping process may be conducted by ion doping or ion implantation. Ion doping is conducted with the conditions of a dosage of $1.5 \times 10^{14}$ atoms/cm$^2$ and an accelerating voltage of 60 to 100 keV. As an impurity element imparting n-type conductivity, phosphorous (P) or arsenic (As) is typically used. In this case, first conductive layers and second conductive layers 124 to 128 become masks against the impurity element imparting n-type conductivity, and first impurity regions 130 to 134 are formed in a self-aligning manner The impurity element imparting n-type conductivity is added to the first impurity regions 130 to 134 in a concentration range of $1 \times 10^{16}$ to $1 \times 10^{17}$/cm$^3$. Here, the region having the same concentration range as the first impurity region is also called an n⁻ region.

Note that although the first doping process is performed after the removal of the masks made of resist in this embodiment, the first doping process may be performed without removing the masks made of resist.

Subsequently, as shown in FIG. 7A, masks 135 to 137 made of resist are formed, and a second doping process is conducted. The mask 135 is a mask for protecting a channel forming region and a periphery thereof of a semiconductor layer forming a p-channel TFT of a driving circuit, the mask 136 is a mask for protecting a channel forming region and a periphery thereof of a semiconductor layer forming one of n-channel TFTs of the driving circuit, and the mask 137 is a mask for protecting a channel forming region, a periphery thereof, and a storage capacitor of a semiconductor layer forming a TFT of a pixel portion.

With the ion doping conditions in the second doping process: a dosage of $1.5\times10^{15}$ atoms/cm$^2$; and an accelerating voltage of 60 to 100 keV, phosphorous (P) is doped. Here, impurity regions are formed in the respective semiconductor layers in a self-aligning manner with the second conductive layers 124b to 126b as masks. Of course, phosphorous is not added to the regions covered by the masks 135 to 137. Thus, second impurity regions 138 to 140 and a third impurity region 142 are formed. The impurity element imparting n-type conductivity is added to the second impurity regions 138 to 140 in a concentration range of $1\times10^{20}$ to $1\times10^{21}$/cm$^3$. Here, the region having the same concentration range as the second impurity region is also called an n$^+$ region.

Further, the third impurity region is formed at a lower concentration than that in the second impurity region by the first conductive layer, and is added with the impurity element imparting n-type conductivity in a concentration range of $1\times10^{18}$ to $1\times10^{19}$/cm$^3$. Note that since doping is conducted by passing the portion of the first conductive layer having a tapered shape, the third impurity region has a concentration gradient in which an impurity concentration increases toward the end portion of the tapered portion. Here, the region having the same concentration range as the third impurity region is called an n$^-$ region. Furthermore, the regions covered by the masks 136 and 137 are not added with the impurity element in the second doping process, and become first impurity regions 144 and 145.

Next, after the masks 135 to 137 made of resist are removed, masks 146 to 148 made of resist are newly formed, and a third doping process is conducted as shown in FIG. 7B.

In the driving circuit, by the third doping process as described above, fourth impurity regions 149, 150 and fifth impurity regions 151, 152 are formed in which an impurity element imparting p-type conductivity is added to the semiconductor layer forming the p-channel TFT and to the semiconductor layer forming the storage capacitor.

Further, the impurity element imparting p-type conductivity is added to the fourth impurity regions 149 and 150 in a concentration range of $1\times10^{20}$ to $1\times10^{21}$/cm$^3$. Note that, in the fourth impurity regions 149, 150, phosphorous (P) has been added in the preceding step (n$^-$ region), but the impurity element imparting p-type conductivity is added at a concentration that is 1.5 to 3 times as high as that of phosphorous. Thus, the fourth impurity regions 149, 150 have a p-type conductivity. Here, the region having the same concentration range as the fourth impurity region is also called a p$^+$ region.

Further, fifth impurity regions 151 and 152 are formed in regions overlapping the tapered portion of the second conductive layer 125a, and are added with the impurity element imparting p-type conductivity in a concentration range of $1\times10^{18}$ to $1\times10^{20}$/cm$^3$. Here, the region having the same concentration range as the fifth impurity region is also called a p$^-$ region.

Through the above-described steps, the impurity regions having n-type or p-type conductivity are formed in the respective semiconductor layers. The conductive layers 124 to 127 become gate electrodes of a TFT. Further, the conductive layer 128 becomes one of electrodes, which forms the storage capacitor in the pixel portion. Moreover, the conductive layer 129 forms a source wiring in the pixel portion.

Next, an insulating film (not shown) that covers substantially the entire surface is formed. In this embodiment, a 50 nm thick silicon oxide film is formed by a plasma CVD method. Of course, the insulating film is not limited to a silicon oxide film, and other insulating films containing silicon may be used in a single layer or a lamination structure.

Then, a step of activating the impurity element added to the respective semiconductor layers is conducted. In this activation step, a rapid thermal annealing (RTA) method using a lamp light source, a method of irradiating light emitted from a YAG laser or an excimer laser from the back surface, a heat treatment using a furnace, or a combination thereof is employed.

Further, although an example in which the insulating film is formed before the activation is shown in this embodiment, a step of forming the insulating film may be conducted after the activation is conducted.

Next, a first interlayer insulating film 153 is formed of a silicon nitride film, and a heat treatment (300 to 550° C. for 1 to 12 hours) is performed, thereby conducting a step of hydrogenating the semiconductor layers. (FIG. 7C) This step is a step of terminating dangling bonds of the semiconductor layers by hydrogen contained in the first interlayer insulating film 153. The semiconductor layers can be hydrogenated irrespective of the existence of an insulating film (not shown) formed of a silicon oxide film. Incidentally, in this embodiment, a material containing aluminum as its main constituent is used for the second conductive layer, and thus, it is important to apply the heating process condition that the second conductive layer can withstand in the step of hydrogenation. As another means for hydrogenation, a plasma hydrogenation (using hydrogen excited by plasma) may be conducted.

Next, a second interlayer insulating film 154 is formed from an organic insulating material on the first interlayer insulating film 153. In this embodiment, an acrylic resin film with a thickness of 1.6 µm is formed. Then, a contact hole that reaches the source wiring 129, contact holes that respectively reach the conductive layers 127 and 128, and contact holes that reach the respective impurity regions are formed. In this embodiment, a plurality of etching processes is sequentially performed. In this embodiment, the second interlayer insulating film is etched with the first interlayer insulating film as the etching stopper, the first interlayer insulating film is etched with the insulating film (not shown) as the etching stopper, and then, the insulating film (not shown) is etched.

Thereafter, wirings and pixel electrodes are formed by using Al, Ti, Mo, W and the like. As the material of the electrodes and pixel electrodes, it is desirable to use a material excellent in reflecting property, such as a film containing Al or Ag as its main constituent or a lamination film of the above film. Thus, source electrodes or drain electrodes 155 to 160, a gate wiring 162, a connection wiring 161, and a pixel electrode 163 are formed.

Figure 8:
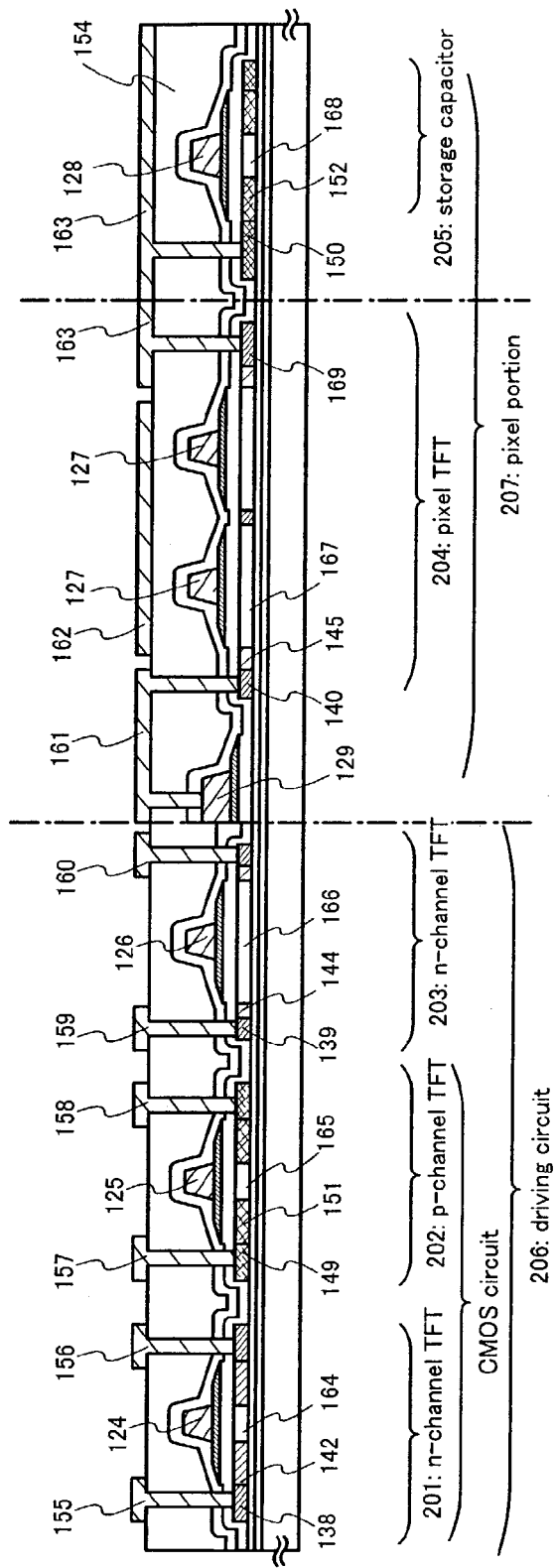
FIG. 8 is a drawing showing a cross sectional view for a process.

As described above, a driving circuit 206 having an n-channel TFT 201, a p-channel TFT 202, and an n-channel TFT 203 and a pixel portion 207 having a pixel TFT 204 comprised of an n-channel TFT and a storage capacitor 205 can be formed on the same substrate (FIG. 8). In this specification, the above substrate is called an active matrix substrate for the sake of convenience.

In the pixel portion 207, the pixel TFT 204 (n-channel TFT) has a channel forming region 167, the first impurity region (n⁻ region) 145 formed outside the conductive layer 127 forming the gate electrode, and the second impurity region (n⁺ region) 140 functioning as a source region. Further, in the semiconductor layer functioning as one of the electrodes of the storage capacitor 205, the fourth impurity region 150 and the fifth impurity region 152 are formed. The storage capacitor 205 is constituted of the second electrode 128 and the semiconductor layers 150, 152, and 168 with the insulating film (the same film as the gate insulating film) 116 as dielectric.

Further, in the driving circuit 206, the n-channel TFT 201 (first n-channel TFIT) has a channel forming region 164, the third impurity region (n⁻ region) 142 that overlaps a part of the conductive layer 124 forming the gate electrode through the insulating film, and the second impurity region (n⁺ region) 138 functioning as a source region or a drain region.

Further, in the driving circuit 206, the p-channel TFT 202 has a channel forming region 165, the fifth impurity region (p⁻ region) 151 that overlaps a part of the conductive layer 125 forming the gate electrode through the insulating film, and the fourth impurity region (p⁺ region) 149 functioning as a source region or a drain region.

Furthermore, in the driving circuit 206, the n-channel TFT 203 (second n-channel TFT) has a channel forming region 166, the first impurity region (n⁻ region) 144 outside the conductive layer 126 forming the gate electrode, and the second impurity region (n⁺ region) 139 functioning as a source region or a drain region.

The above TFTs 201 to 203 are appropriately combined to form a shift register circuit, a buffer circuit, a level shifter circuit, a latch circuit and the like, thereby forming the driving circuit 206. For example, in the case where a CMOS circuit is formed, the n-channel TFT 201 and the p-channel TFT 202 may be complementarily connected to each other.

In particular, the structure of the n-channel TFT 203 is appropriate for the buffer circuit having a high driving voltage with the purpose of preventing deterioration due to a hot carrier effect.

Moreover, the structure of the n-channel TFT 201, which is a GOLD structure, is appropriate for the circuit in which the reliability takes top priority.

From the above, the reliability can be improved by improving the flatness of the semiconductor film surface. Thus, in the TFT having the GOLD structure, sufficient reliability can be obtained even if the area of the impurity region that overlaps the gate electrode through the gate insulating film is reduced. Specifically, in the TFT having the GOLD structure, sufficient reliability can be obtained even if the size of the portion that becomes the tapered portion of the gate electrode is reduced.

In the TFT with the GOLD structure, a parasitic capacitance increases when the gate insulating film is thinned. However, the size of the tapered portion of the gate electrode (first conductive layer) is reduced to reduce the parasitic capacitance, whereby the TFT becomes to enable high-speed operation with improved f-characteristics and to have sufficient reliability.

Further, an example of fabricating the active matrix substrate for forming a reflection type display device is shown in this example. However, if the pixel electrode is formed of a transparent conductive film, a transmission type display device can be formed although the number of photomasks is increased by one.

In addition, this embodiment can be freely combined with Embodiment mode.

EMBODIMENT 2

This embodiment describes a process of fabricating an active matrix liquid crystal display device from the active matrix substrate fabricated in Embodiment 1. The description is given with reference to FIG. 9.

After the active matrix substrate as illustrated in FIG. 8 is obtained in accordance with Embodiment 1, an oriented film is formed on the active matrix substrate of FIG. 8 and subjected to a rubbing treatment. In this embodiment, before the oriented film is formed, an organic resin film such as an acrylic resin film is patterned to form columnar spacers in desired positions in order to keep the substrates apart. The columnar spacers may be replaced by spherical spacers sprayed onto the entire surface of the substrate.

An opposite substrate is prepared next. The opposite substrate has a color filter in which colored layers and light-shielding layers are arranged with respect to the pixels. A light-shielding layer is also placed in the driving circuit portion. A planarization film is formed to cover the color filter and the light-shielding layer. On the planarization film, an opposite electrode is formed from a transparent conductive film in the pixel portion. An oriented film is formed over the entire surface of the opposite substrate and is subjected to a rubbing treatment.

Then the opposite substrate is bonded to the active matrix substrate on which the pixel portion and the driving circuits are formed, using a sealing agent. The sealing agent has filler mixed therein and the filler, together with the columnar spacers, keeps the distance between the two substrates while they are bonded. Thereafter a liquid crystal material is injected between the substrates and an sealant (not shown) is used to completely seal the substrates. A known liquid crystal material can be used. The active matrix liquid crystal display device is thus completed. If necessary, the active matrix substrate or the opposite substrate is cut into pieces of desired shapes. Further, the display device may be appropriately provided with an optical film such as a polarizing plate and a phase difference plate using a known technique. Then FPCs are attached to the substrate using a known technique.

The structure of the thus obtained liquid crystal module is described with reference to the top view in FIG. 9.

A pixel portion 304 is placed in the center of an active matrix substrate 301. A source signal line driving circuit 302 for driving source signal lines is positioned above the pixel portion 304. Gate signal line driving circuits 303 for driving gate signal lines are placed to the left and right of the pixel portion 304. Although the gate signal line driving circuits 303 are arranged symmetrically with respect to the pixel portion in this embodiment, the liquid crystal module may have only one gate signal line driving circuit on one side of the pixel portion. Of the above two options, a designer can choose the arrangement that suits better considering the substrate size or the like of the liquid crystal module. However, the symmetrical arrangement of the gate signal line driving circuits shown in FIG. 9 is preferred in terms of circuit operation reliability, driving efficiency, and the like.

Signals are inputted to the respective driving circuits from flexible printed circuits (FPC) 305. The FPCs 305 are press-fit through an anisotropic conductive film or the like after opening contact holes in the interlayer insulating film and resin film and forming a connection electrode 309 (not shown) so as to reach the wiring lines arranged in given places of the substrate 301. The connection electrode is formed from ITO in this embodiment.

A sealing agent 307 is applied to the substrate along its perimeter surrounding the driving circuits and the pixel portion. An opposite substrate 306 is bonded to the substrate 301 by the sealing agent 307 while a spacer 310 (not shown) formed in advance on the active matrix substrate keeps the distance between the two substrates constant (the distance between the substrate 301 and the opposed substrate 306). A liquid crystal element is injected through an area of the substrate that is not coated with the sealing agent 307. The substrates are then sealed by an sealant 308. The liquid crystal module is completed through the above steps.

Although all of the driving circuits are formed on the substrate in the example shown here, several ICs may be used for some of the driving circuits.

Further, this embodiment can be freely combined with Embodiments and Embodiment 1.

EMBODIMENT 3

Embodiment 1 shows an example of a reflective display device in which a pixel electrode is formed from a reflective metal material. Shown with FIG. 10 in this embodiment is an example of transmissive display device in which a pixel electrode is formed from a light-transmitting conductive film.

The fabricate processes up through the step of forming an interlayer insulating film are identical with the processes of Embodiment 1, and the description thereof is omitted here. After the interlayer insulating film is formed in accordance with Embodiment 1, a pixel electrode 601 is formed from a light-transmitting conductive film. Examples of the light-transmitting conductive film include an ITO (indium tin oxide alloy) film, an indium oxide-zinc oxide alloy ($In_2O_3$—ZnO) film, a zinc oxide (ZnO) film, and the like.

Thereafter, contact holes are formed in an interlayer insulating film 600. A connection electrode 602 overlapping the pixel electrode is formed next. The connection electrode 602 is connected to a drain region through the contact hole. At the same time the connection electrode is formed, source electrodes or drain electrodes of other TFTs are formed.

Although all of the driving circuits are formed on the substrate in the example shown here, several ICs may be used for some of the driving circuits.

Figure 10:
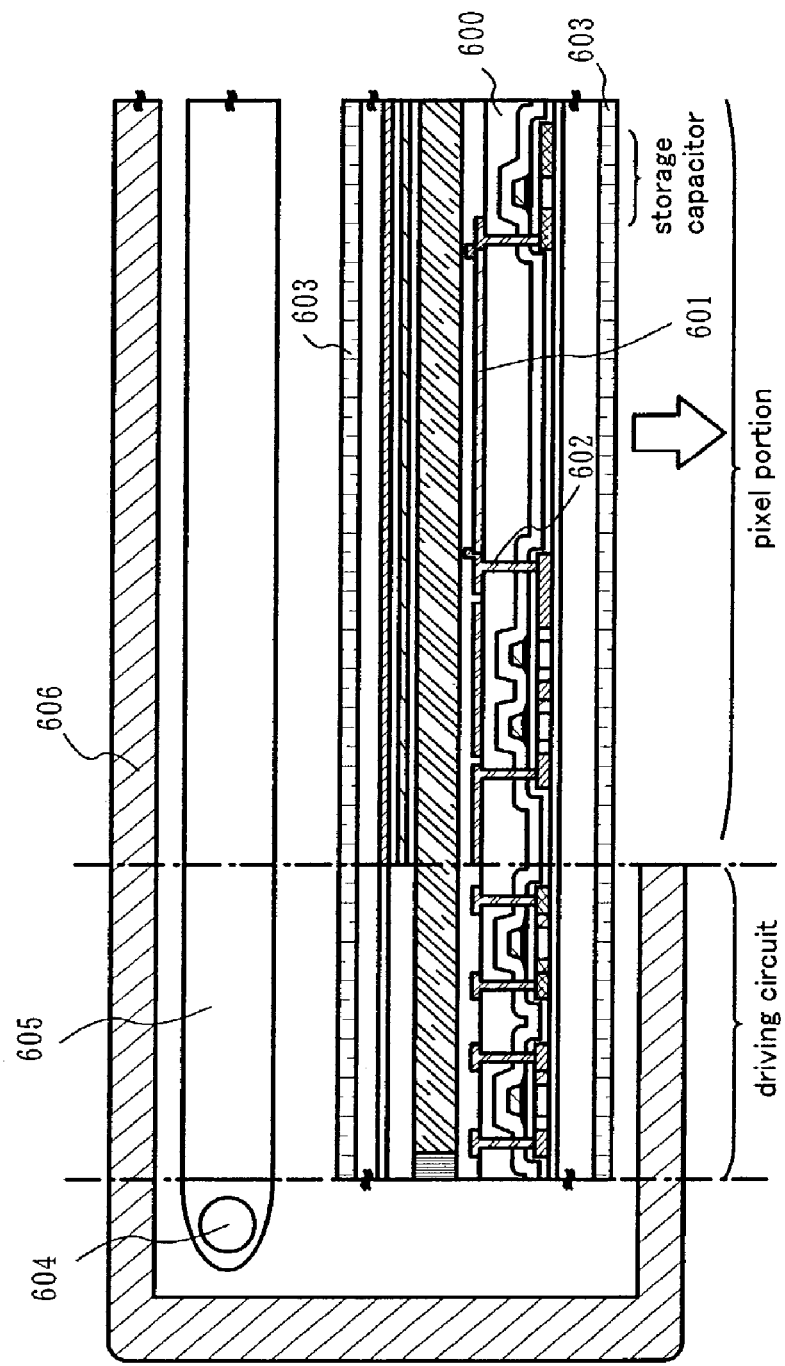
FIG. 10 is a sectional, structural view of an active matrix type liquid crystal display device.

An active matrix substrate is completed as above. A liquid crystal module is fabricated from this active matrix substrate in accordance with Embodiment 2. The liquid crystal module is provided with a backlight 604 and a light guiding plate 605, and is covered with a cover 606 to complete the active matrix type liquid crystal display device of which a partial sectional view is shown in FIG. 10. The cover is bonded to the liquid crystal module using an adhesive or an organic resin. When bonding the substrate to the opposite substrate, the substrates may be framed so that the space between the frame and the substrates is filled with an organic resin for bonding. Since the display device is of transmissive type, the active matrix substrate and the opposite substrate each needs a polarizing plate 603 to be bonded.

This embodiment can be freely combined with Embodiments, Embodiment 1 or 2.

EMBODIMENT 4

Figure 11A:
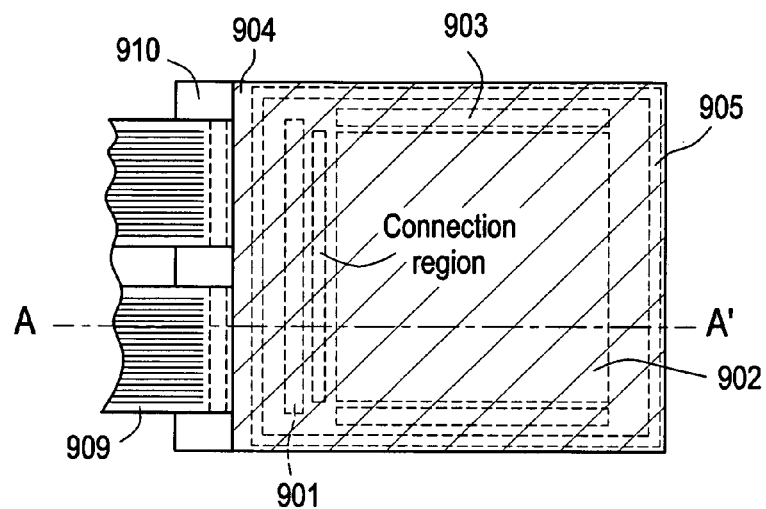
FIGS. 11A–11B are drawing showings a plan view and a sectional view of a light emissive device.
Figure 11B:
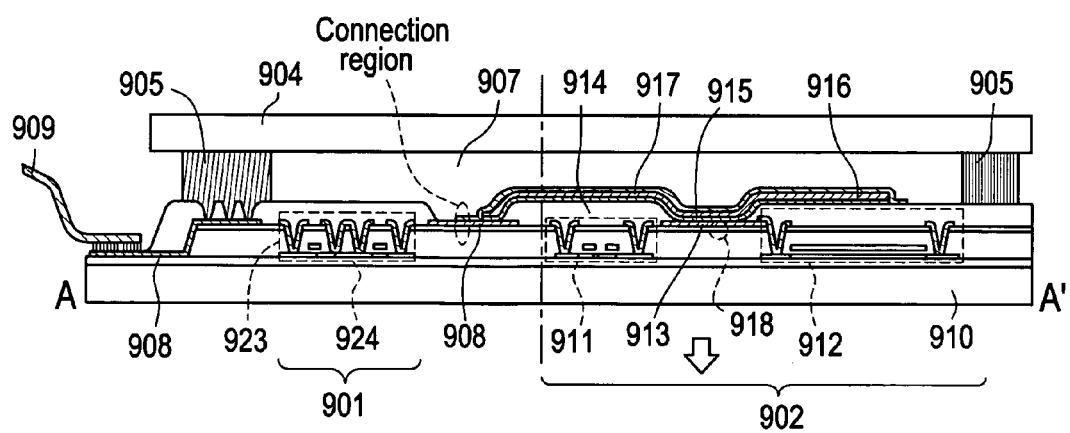

In this embodiment, an example of fabricating a light emitting device including an organic light emitting device (OLED) is shown in FIGS. 11A–11B.

The OLED has a layer containing an organic compound (organic light emitting material) to cause electroluminescence under the application of an electric field (hereinafter, referred to as an organic light emitting layer), an anode and a cathode. The electroluminescence on an organic compound includes the emission of light of upon returning from a singlet excitation state into the ground state (fluorescence) and the emission of light of upon returning from a triplet excitation state into the ground state (phosphorescence). The light emitting device of the present invention may use either one or both of such emission of light.

In the specification, every layer provided between a cathode and an anode of the OLED is defined as an organic light emitting layer. The organic light emitting layer, concretely, includes a light emitting layer, a hole injection layer, an electron injection layer, a hole transport layer, an electron transport layer, etc. Basically, the OLED has a structure layered with an anode, a light emitting layer and a cathode in the order. In addition to this structure, some structures possess an anode, a hole injection layer, a light emitting layer and a cathode or an anode, a hole injection layer, a light emitting layer, an electron transport layer and a cathode in the order.

Further, an exterior view of an active matrix type light emitting device is described with reference to FIGS. 1A–1B. Further, FIG. 11A is a top view showing the light emitting device and FIG. 11B is a cross-sectional view of FIG. 11A taken along a line A–A'. Reference numeral 901 indicated by a dotted line designates a source signal line driving circuit, numeral 902 designates a pixel portion, and numeral 903 designates a gate signal line driving circuit. The pixel portion and driving circuit can be obtained in accordance with the above-described embodiments. Further, numeral 904 designates a seal substrate, numeral 905 designates a seal agent and an inner side surrounded by the seal agent 905 constitutes a space 907.

Further, reference numeral 908 designates a wiring for transmitting signals inputted to the source signal line driving circuit 901 and the gate signal line driving circuit 903 for receiving a video signal or a clock signal from FPC (flexible printed circuit) 909 for constituting an external input terminal. Further, although only FPC is illustrated here, the FPC may be attached with a printed wiring board (PWB). The light emitting device in the specification includes not only a main body of the light emitting device but also a state in which FPC or PWB is attached thereto. Moreover, although a complex integrated circuit (memory, CPU, controller, D/A converter or the like) are capable of being formed on the same substrate with these pixel portion and drive portion, the fabrication with a small number of masks is difficult. Therefore, it is preferred that an IC chip equipped with a memory, a CPU, a controller, a D/A converter or the like is mounted by a COG (Chip On Glass) method, or a TAB (Tape Automated Bonding) method or a wire bonding method.

Next, a sectional structure will be explained in reference to FIG. 11B. A driving circuit and a pixel portion are formed on a substrate 910 and here, a source signal line driving circuit 901 serving as the driving circuit and a pixel portion 902 are shown.

Further, the source signal line driving circuit 901 is formed with a CMOS circuit combined with an n-channel type TFT 923 and a p-channel type TFT 924. Further, TFTs for forming the driving circuit may be formed by a publicly known CMOS circuit, a PMOS circuit or a NMOS circuit. Further, although according to the embodiment, a driver integrated type formed with the driving circuits on the substrate is shown, the driver integrated type is not necessarily be needed and the driving circuits can be formed not on the substrate but at outside thereof.

Further, the pixel portion 902 is formed by a plurality of pixels each including a switching TFT 911 and a first electrode (anode) 913 electrically connected to a drain thereof. It should be note that although only an example of using a top gate TFT is shown here, it is not limited to this configuration of TFTs and a bottom gate TFT, for example, can be used.

Insulators 914 are formed on both ends of the first electrode (anode) 913. On the first electrode (anode) 913, a layer 915 containing an organic compound is formed. On the layer 915 containing an organic compound, a second electrode (cathode) 916 having the same pattern shape as that of the layer 915 containing an organic compound and having an end being flush with that of the layer 915 is formed. As a result, a light emitting element 918 composed of the first electrode (anode) 913, the layer 915 containing an organic compound, and the second electrode (cathode) 916 is formed. Since the light emitting element 918 emits white light in this example, a color filter (not shown for simplification) composed of a colored layer and BM is provided on the substrate 910.

For electrical connection between the second electrode 916 and the wiring 908, a third electrode 917 shown in Embodiment Mode 4 is formed in this embodiment. The third electrode 917, which is in contact with the second electrode 916 and the wiring 908, functions as a common wiring for all pixels. The third electrode 917 is electrically connected to the FPC (terminal portion) 909 via the wiring 908.

Further, in order to seal the light emitting element 918 formed on the substrate 910, the seal substrate 904 is pasted by the seal agent 905. Further, a spacer comprising a resin film may be provided for ensuring an interval between the seal substrate 904 and the light emitting element 918. Further, the space 907 on the inner side of the seal agent 905 is filled with an inert gas of nitrogen or the like. Further, it is preferable to use epoxy species resin for the seal agent 905. Further, it is preferable that the seal agent 905 is a material for permeating moisture or oxygen as less as possible. Further, the inner portion of the space 907 may be included with the substance having an effect of absorbing oxygen of water.

Further, according to this embodiment, as a material for constituting the seal substrate 904, other than a glass substrate or a quartz substrate, a plastic substrate comprising FRP (Fiberglass-Reinforced Plastics), PVF (polyvinyl fluoride), Mylar, polyester or acrylic resin can be used. Further, it is possible to adhere the seal substrate 904 by using the seal agent 905 and thereafter seal to cover a side face (exposed face) by a seal agent.

By sealing the light emitting element in the space 907 as described above, the light emitting element can completely be blocked from outside and a substance for accelerating to deteriorate the organic compound layer such as moisture or oxygen can be prevented from invading from outside. Therefore, a highly reliable light emitting device can be provided.

Further, a display device having the OLED includes driving methods such as a driving method which is designed so as to apply a constant voltage and supply a electric current into the OLED; a driving method which is designed so as to control a voltage applied to the OLED in order to provide a constant electric current in the OLED; and a driving method which is designed so as to provide a constant electric current in the OLED. However, the luminance of a pixel is determined by an ON current ($I_{on}$) of a TFT (a TFT 912 is referred to as the TFT for controlling the current in this specification) which are electrically connected to the OLED and provide an electric current to the OLED in stead of the driving method. Therefore, there is a problem of causing unevenness in luminance if ON currents in the respective TFTs are not constant. This problem can be solved by the present invention.

Moreover, the pixel electrode is set as a cathode, the EL layer and the anode are laminated and it may be configured so that the light is emitted in the reverse direction of FIG. 11A.

Further, this embodiment can freely be combined with Embodiment mode and Embodiment 1.

EMBODIMENT 5

A driving circuit and a pixel portion formed by the present invention can be used to various modules (such as an active matrix type liquid crystal display device, an active matrix type EL module, and active matrix type EC module). Accordingly, all electronic apparatuses incorporated with these modules can be completed by implementing the present invention.

Such electronic apparatuses include a video camera, a digital camera, a head mount display (goggles-type display), a car navigation system, projectors, a car stereo, a personal computer, a portable information terminal (such as a mobile computer, a mobile telephone, and an electronic book), or the like. FIGS. 12A to 12F and FIGS. 13A to 13C respectively shows various specific examples of such electronic apparatuses.

Figure 12A:
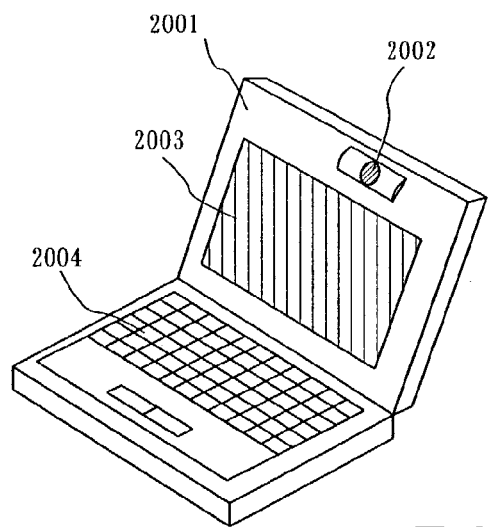
FIGS. 12A–12F are drawings showing examples of electronic apparatuses.

FIG. 12A is a personal computer which comprises: a main body 2001; an image input portion 2002; a display portion 2003; a keyboard 2004 and the like.

Figure 12B:
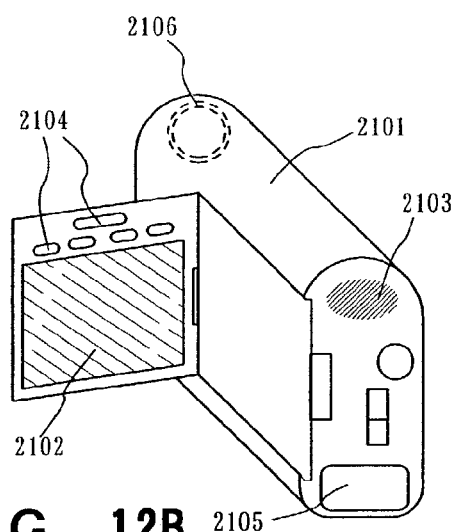

FIG. 12B is a video camera which comprises: a main body 2101; a display portion 2102; a voice input portion 2103; operation switches 2104; a battery 2105; an image receiving portion 2106 and the like.

Figure 12C:
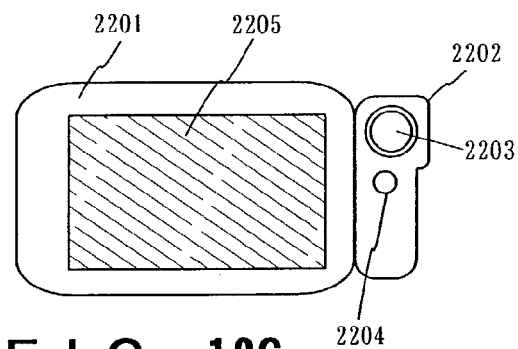

FIG. 12C is a mobile computer which comprises: a main body 2201; a camera portion 2202; an image receiving portion 2203; operation switches 2204; a display portion 2205 and the like.

Figure 12D:
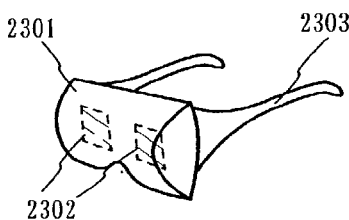

FIG. 12D is a goggle type display which comprises: a main body 2301; a display portion 2302; an arm portion 2303 and the like.

Figure 12E:
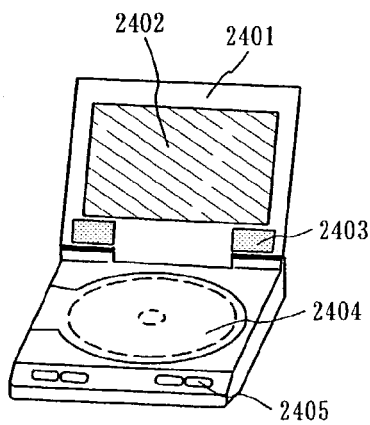

FIG. 12E is a player using a recording medium which records a program (hereinafter referred to as a recording medium), which comprises: a main body 2401; a display portion 2402; a speaker portion 2403; a recording medium 2404; operation switches 2405 and the like. This apparatus uses DVD (digital versatile disc), CD, etc. for the recording medium, and can perform music appreciation, film appreciation, games and use for Internet.

Figure 12F:
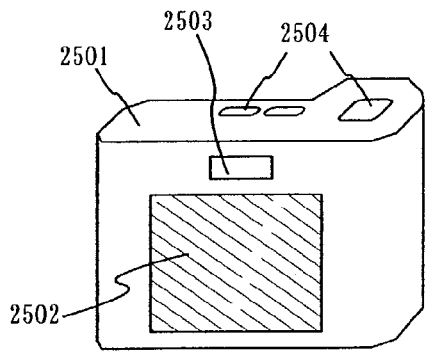

FIG. 12F is a digital camera which comprises: a main body 2501; a display portion 2502; a view finder 2503; operation switches 2504; and an image receiving portion (not shown in the figure).

Figure 13A:
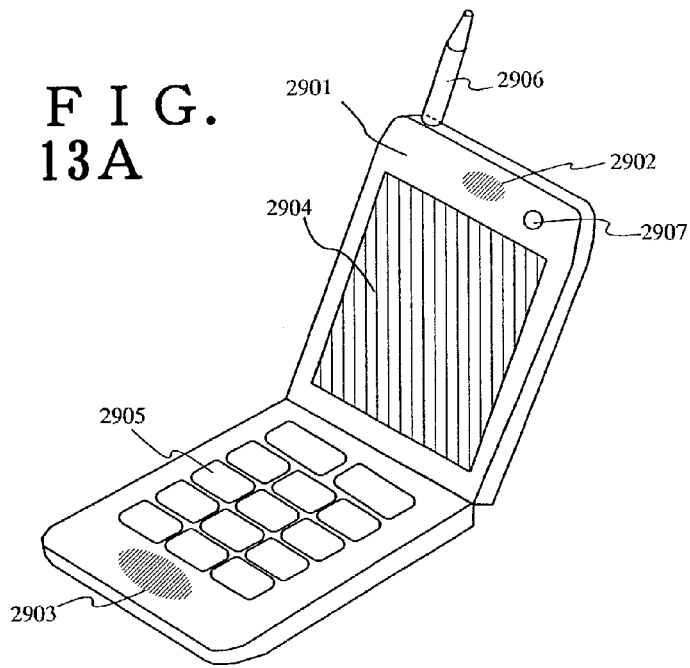
FIGS. 13A–13C are drawings showing examples of electronic apparatuses.

FIG. 13A is a mobile phone which comprises: a main body 2901; a voice output portion 2902; a voice input portion 2903; a display portion 2904; operation switches 2905; an antenna 2906; and an image input portion (CCD, image sensor, etc.) 2907 etc.

Figure 13B:
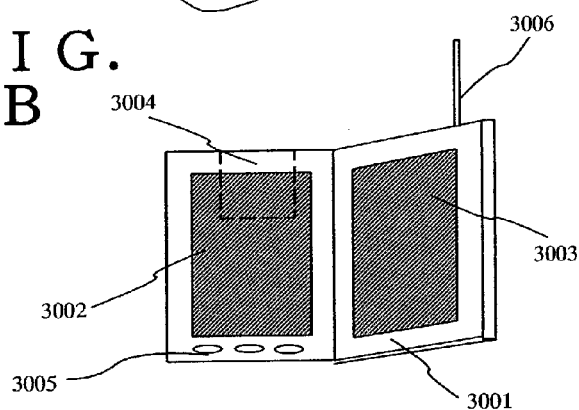

FIG. 13B is a portable book (electronic book) which comprises: a main body 3001; display portions 3002 and 3003; a recording medium 3004; operation switches 3005 and an antenna 3006 etc.

Figure 13C:
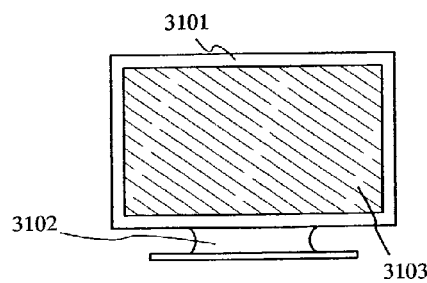

FIG. 13C is a display which comprises: a main body 3101; a supporting base 3102; and a display portion 3103 etc.

In addition, the display shown in FIG. 13C has small and medium-sized or large-sized screen, for example a size of 5 to 20 inches. Further, to fabricate the display part with such sizes, it is preferable to mass-produce by gang printing by using a substrate with one meter on a side.

As described above, the applicable range of the present invention is so large that the invention can be applied to various electronic apparatuses in all fields. Note that the electronic apparatuses of this embodiment can be achieved by utilizing any combination of configurations in Embodiment mode and Embodiments 1 to 4.

According to the invention, a semiconductor film having a crystal structure where a metal element that helps the crystallization is sufficiently reduced or removed can be obtained, and improvement of an electric property and reduction of the variation among individual elements are achieved in a TFT having the semiconductor film as an active layer. Particularly, in a liquid crystal display device, unevenness in display due to the variation of TFT characteristic can be reduced.

When the heating temperature in the getting process is increased to equal or over 600° C., a semiconductor film having a crystal structure where the metal element that helps the crystallization is reduced or removed to the minimum limit of detection or less can be obtained.

In addition, in a semiconductor device having an OLED, variation of ON-state current ($I_{on}$) of a TFT arranged such that a constant electric current flows through a pixel electrode (a TFT for supplying an electric current to the OLED arranged in a driving circuit or pixel) can be reduced, thereby variation of luminance can be reduced.

According to the invention, not only the metal element helping the crystallization, but also other metal elements being impurities (Fe, Cu) can be removed or reduced.

What is claimed is:

1. A method for fabricating a semiconductor device comprising:
   forming a first semiconductor film having an amorphous structure over an insulating surface;
   providing the first semiconductor film having the amorphous structure with a metal element;
   crystallizing the first semiconductor film;
   forming a barrier layer over the crystallized first semiconductor film;
   forming a second semiconductor film containing a rare-gas element over the barrier layer;
   forming an anti-diffusion film for the rare-gas element over the second semiconductor film;
   performing a heating treatment, thereby removing or reducing the metal element contained in the crystallized first semiconductor;
   removing the anti-diffusion film after the heating treatment;
   removing the second semiconductor film after removing the anti-diffusion film; and
   removing the barrier layer after removing the second semiconductor film.

2. The method for fabricating the semiconductor device of claim 1, wherein the anti-diffusion film is a silicon nitride film or a silicon oxynitride film.

3. The method for fabricating the semiconductor device of claim 1, wherein the anti-diffusion film has a tensile stress in a range from $1 \times 10^8$ to $1 \times 10^{10}$ dyne/cm$^2$.

4. The method for fabricating the semiconductor device of claim 1, wherein in forming the second semiconductor film containing the rare-gas element, deposition is performed by a sputter method.

5. The method for fabricating the semiconductor device of claim 1, wherein in forming the second semiconductor film containing the rare-gas element, the film is formed by a plasma CVD method in which a flow ratio of monosilane to the rare-gas (SiH$_4$/rare-gas) introduced in a deposition chamber is controlled to be 0.1/99.9 to 1/9, and a pressure in the deposition chamber is 1.333 Pa to 133.322 Pa.

6. The method for fabricating the semiconductor device of claim 1, wherein the barrier layer is at least a silicon oxide film and silicon oxide-nitride film having 1 nm to 10 nm in thickness.

7. The method for fabricating the semiconductor device of claim 1, wherein the metal element is one element or a plurality of elements selected from the group consisting of Fe, Ni, Co, Ru, Rh, Pd, Os, Ir, Pt, Cu, and Au.

8. The method for fabricating the semiconductor device of claim 1, wherein the rare-gas element is one or more kinds of members selected from the group consisting of He, Ne, Ar, Kr, and Xe.

9. A method for fabricating a semiconductor device comprising:
   forming a first semiconductor film having an amorphous structure over an insulating surface;
   providing the first semiconductor film having the amorphous structure with a metal element;
   crystallizing the first semiconductor film;
   forming a barrier layer over the crystallized first semiconductor film;
   forming a second semiconductor film containing a rare-gas element over the barrier layer;
   forming a silicon nitride film to prevent diffusion of the rare-gas element over the second semiconductor film;
   performing a heating treatment, thereby removing or reducing the metal element contained in the crystallized first semiconductor film;
   removing the silicon nitride film after the heating treatment;
   removing the second semiconductor film after removing the silicon nitride film; and
   removing the barrier layer after removing the second semiconductor film.

10. The method for fabricating the semiconductor device of claim 9, wherein a thickness range of the silicon nitride film is 10 nm to 300 nm.

11. The method for fabricating the semiconductor device of claim 9, wherein the silicon nitride film has a tensile stress in a range from $1 \times 10^8$ to $1 \times 10^{10}$ dyne/cm$^2$.

12. The method for fabricating the semiconductor device of claim 9, wherein in forming the second semiconductor film containing the rare-gas element, deposition is performed by a sputter method.

13. The method for fabricating the semiconductor device of claim 9, wherein in forming the second semiconductor film containing the rare-gas element, the film is formed by a plasma CVD method in which a flow ratio of monosilane to the rare-gas (SiH$_4$/rare-gas) introduced in a deposition chamber is controlled to be 0.1/99.9 to 1/9, and a pressure in the deposition chamber is 1.333 Pa to 133.322 Pa.

14. The method for fabricating the semiconductor device of claim 9, wherein the barrier layer is at least a silicon oxide film and silicon oxide-nitride film having 1 nm to 10 nm in thickness.

15. The method for fabricating the semiconductor device of claim 9, wherein the metal element is one element or a plurality of elements selected from the group consisting of Fe, Ni, Co, Ru, Rh, Pd, Os, Ir, Pt, Cu, and Au.

16. The method for fabricating the semiconductor device of claim 9, wherein the rare-gas element is one or more kinds of members selected from the group consisting of He, Ne, Ar, Kr, and Xe.

17. A method for fabricating a semiconductor device comprising:
forming a first semiconductor film having an amorphous structure over an insulating surface;
providing the first semiconductor film having the amorphous structure with a metal element;
crystallizing the first semiconductor film;
forming a barrier layer over the crystallized first semiconductor film;
forming a second semiconductor film containing a rare-gas element over the barrier layer;
forming a silicon oxynitride film to Drevent diffusion of the rare-gas element over the second semiconductor film;
performing a heating treatment, thereby removing or reducing the metal element contained in the crystallized first semiconductor film;
removing the silicon oxynitride film after the heating treatment;
removing the second semiconductor film after removing the silicon oxynitride film; and
removing the barrier layer after removing the second semiconductor film.

18. The method for fabricating the semiconductor device of claim 17, wherein a thickness range of the silicon oxynitride film is 10 nm to 300 nm.

19. The method for fabricating the semiconductor device of claim 17, wherein the silicon oxynitride film has a tensile stress in a range from $1 \times 10^8$ to $1 \times 10^{10}$ dyne/cm$^2$.

20. The method for fabricating the semiconductor device of claim 17, wherein in forming the second semiconductor film containing the rare-gas element, deposition is performed by a sputter method.

21. The method for fabricating the semiconductor device of claim 17, wherein in forming the second semiconductor film containing the rare-gas element, the film is formed by a plasma CVD method in which a flow ratio of monosilane to the rare-gas (SiH$^4$/rare-gas) introduced in a deposition chamber is controlled to be 0.1/99.9 to 1/9, and a pressure in the deposition chamber is 1.333 Pa to 133.322 Pa.

22. The method for fabricating the semiconductor device of claim 17, wherein the barrier layer is at least a silicon oxide film and silicon oxide-nitride film having 1 nm to 10 nm in thickness.

23. The method for fabricating the semiconductor device of claim 17, wherein the metal element is one element or a plurality of elements selected from the group consisting of Fe, Ni, Co, Ru, Rh, Pd, Os, Ir, Pt, Cu, and Au.

24. The method for fabricating the semiconductor device of claim 17, wherein the rare-gas element is one or more kinds of members selected from the group consisting of He, Ne, Ar, Kr, and Xe.

25. A method for fabricating a semiconductor device comprising:
crystallizing a first semiconductor film over an insulating surface;
forming a barrier layer over the crystallized first semiconductor film;
forming a second semiconductor film containing a rare-gas element over the barrier layer;
forming an anti-diffusion film for the rare-gas element over the second semiconductor film;
performing a heating treatment, thereby removing or reducing a metal element contained in the crystallized first semiconductor film;
removing the anti-diffusion film after performing the heating treatment; and
removing the second semiconductor film after removing the anti-diffusion film.

26. The method for fabricating the semiconductor device of claim 25, wherein the anti-diffusion film is a silicon nitride film or a silicon oxynitride film.

27. The method for fabricating the semiconductor device of claim 25, wherein the anti-diffusion film has a tensile stress in a range from $1 \times 10^8$ to $1 \times 10^{10}$ dyne/cm$^2$.

28. The method for fabricating the semiconductor device of claim 25, wherein in forming the second semiconductor film containing the rare-gas element, deposition is performed by a sputter method.

29. The method for fabricating the semiconductor device of claim 25, wherein in forming the second semiconductor film containing the rare-gas element, the film is formed by a plasma CVD method in which a flow ratio of monosilane to the rare-gas (SiH$_4$/rare-gas) introduced in a deposition chamber is controlled to be 0.1/99.9 to 1/9, and a pressure in the deposition chamber is 1.333 Pa to 133.322 Pa.

30. The method for fabricating the semiconductor device of claim 25, wherein the barrier layer is at least a silicon oxide film and silicon oxide-nitride film having 1 nm to 10 nm in thickness.

31. The method for fabricating the semiconductor device of claim 25, wherein the metal element is one element or a plurality of elements selected from the group consisting of Fe, Ni, Co, Ru, Rh, Pd, Os, Ir, Pt, Cu, and Au.

32. The method for fabricating the semiconductor device of claim 25, wherein the rare-gas element is one or more kinds of members selected from the group consisting of He, Ne, Ar, Kr, and Xe.

* * * * *